US012336162B2

(12) United States Patent
Shao et al.

(10) Patent No.: US 12,336,162 B2
(45) Date of Patent: Jun. 17, 2025

(54) MEMORY, SEMICONDUCTOR STRUCTURE AND FORMATION METHOD THEREOF

(71) Applicant: CHANGXIN MEMORY TECHNOLOGIES, INC., Hefei (CN)

(72) Inventors: Guangsu Shao, Hefei (CN); Xingsong Su, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 573 days.

(21) Appl. No.: 17/844,035

(22) Filed: Jun. 19, 2022

(65) Prior Publication Data

US 2023/0320060 A1    Oct. 5, 2023

Related U.S. Application Data

(63) Continuation of application No. PCT/CN2022/086892, filed on Apr. 14, 2022.

(30) Foreign Application Priority Data

Apr. 1, 2022   (CN) .......................... 202210349047.3

(51) Int. Cl.
    *H10B 12/00*    (2023.01)
(52) U.S. Cl.
    CPC ............. *H10B 12/03* (2023.02); *H10B 12/30* (2023.02)
(58) Field of Classification Search
    None
    See application file for complete search history.

(56) References Cited

U.S. PATENT DOCUMENTS

| 2017/0194328 A1* | 7/2017 | Park ..................... H10D 64/519 |
| 2020/0395438 A1* | 12/2020 | Kang .................. H01L 23/5222 |
| 2022/0115376 A1* | 4/2022 | Kim ..................... H10B 12/033 |

FOREIGN PATENT DOCUMENTS

| CN | 112071840 A | 12/2020 |
| CN | 113130748 A | 7/2021 |
| CN | 114141711 A | 3/2022 |
| JP | 2008010866 A | 1/2008 |

* cited by examiner

*Primary Examiner* — Sue A Purvis
*Assistant Examiner* — Jordan M Klein
(74) *Attorney, Agent, or Firm* — Kilpatrick Townsend & Stockton LLP

(57) ABSTRACT

Embodiment relates to the field of semiconductor technology, and more particularly, to a memory, a semiconductor structure and a formation method thereof. The formation method of the present disclosure includes: providing a substrate; forming a plurality of groups of support pillars spaced apart along a first direction in the substrate, each of the plurality of groups of support pillars being spaced apart along a second direction, the first direction intersecting with the second direction; forming a support layer filling up top gaps between adjacent two of the support pillars; forming an epitaxial pillar on a top of each of the support pillars respectively by means of an epitaxial growth process; and forming a capacitor structure on a surface of a structure jointly constituted by each of the epitaxial pillars and each of the support pillars.

18 Claims, 9 Drawing Sheets

MEMORY, SEMICONDUCTOR STRUCTURE AND FORMATION METHOD THEREOF

CROSS-REFERENCE TO RELATED APPLICATION

The present disclosure is a continuation of PCT/CN2022/086892, filed on April 14, which claims priority to Chinese Patent Application No. 202210349047.3, titled "MEMORY, SEMICONDUCTOR STRUCTURE AND FORMATION METHOD THEREOF" and filed on Apr. 1, 2022, the entire contents of which are incorporated herein by reference.

TECHNICAL FIELD

The present disclosure relates to the field of semiconductor technology, and more particularly, to a memory, a semiconductor structure and a formation method thereof.

BACKGROUND

Dynamic Random Access Memory (DRAM) is widely used in mobile devices such as mobile phones and tablet computers due to its advantages of small size, high integration and fast transmission speed, etc. As core components of the DRAM, capacitors are mainly configured to store electric charges.

Generally, in the process of manufacturing the capacitors, it is required to form support layers and sacrificial layers overlapped with each other on substrates; the support layers and the sacrificial layers are etched to form porous structures for housing the capacitors; and the sacrificial layers are removed after the capacitors are formed. However, due to limitation of fabrication technologies, etching depths of film layers are different in different etching regions during formation of the porous structures. After the sacrificial layers are removed, a part of the capacitors fail due to floating, and this part of the capacitors are vulnerable to collapse, leading to lower device yield.

It is to be noted that the information disclosed in the above background art section is only for enhancement of understanding of the background of the present disclosure, and therefore may contain information that does not constitute the prior art that is already known to a person of ordinary skill in the art.

SUMMARY

An objective of the present disclosure is to overcome the above-mentioned deficiencies of the prior art, and to provide a memory, a semiconductor structure and a formation method thereof.

According to an aspect of the present disclosure, there is provided a method for fabricating a semiconductor structure, and the method includes:
  providing a substrate;
  forming a plurality of groups of support pillars spaced apart along a first direction in the substrate, each of the plurality of groups of support pillars being spaced apart along a second direction, the first direction intersecting with the second direction;
  forming a support layer filling up top gaps between adjacent two of the support pillars;
  forming an epitaxial pillar on a top of each of the support pillars respectively by means of an epitaxial growth process; and
  forming a capacitor structure on a surface of a structure jointly constituted by each of the epitaxial pillars and each of the support pillars.

According to an aspect of the present disclosure, there is provided a semiconductor structure, which includes:
  a substrate comprising a plurality of groups of support pillars spaced apart along a first direction, each of the plurality of groups of support pillars being spaced apart along a second direction, the first direction intersecting with the second direction;
  a support layer filled in a top gap between adjacent two of the support pillars;
  a plurality of epitaxial pillars formed on tops of the support pillars in one-to-one correspondence; and
  a capacitor structure formed on a surface of a structure jointly constituted by each of the epitaxial pillars and each of the support pillars.

According to an aspect of the present disclosure, there is provided a memory, which includes the semiconductor structure according to any one of the foregoing embodiments.

It is to be understood that the above general description and the detailed description below are merely exemplary and explanatory, and do not limit the present disclosure.

BRIEF DESCRIPTION OF THE DRAWINGS

The accompanying drawings here are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
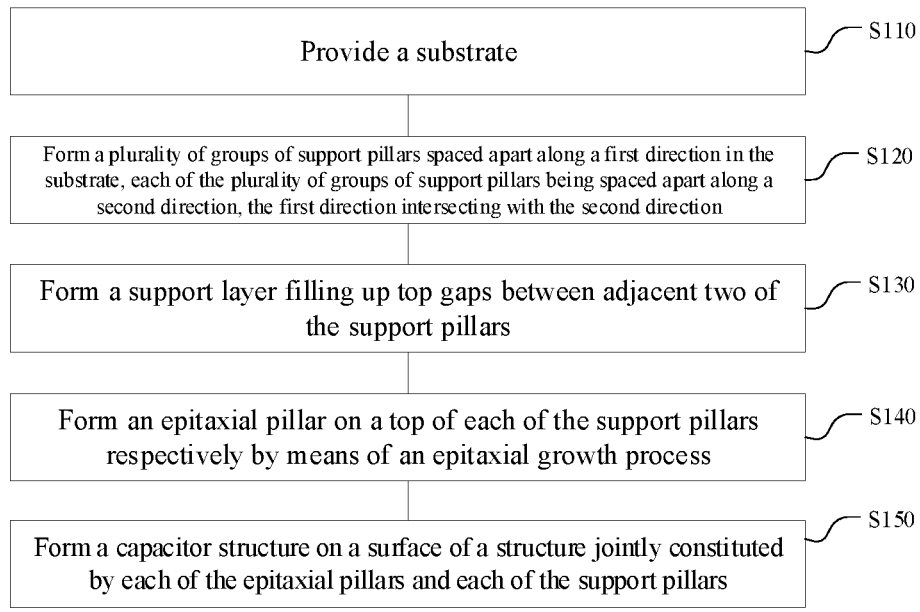
FIG. 1 is a flowchart of a method for forming a semiconductor structure according to an embodiment of the present disclosure.

Exemplary embodiments will now be described more comprehensively with reference to the accompanying drawings. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and their detailed description will be omitted. In addition, the accompanying drawings are merely exemplary illustration of the present disclosure, and are not necessarily drawn to scale.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a", "said", "the" and "at least one" may be intended to indicate presence of one or more elements/constituent parts, etc. The terms "comprising" and "having" are inclusive and therefore specify the presence of other elements/constituent parts or the like in addition to the elements/constituent parts listed out. The terms "first", "second", "third" and "fourth" or the like are merely for marker purposes, and do not impose numerical limitations on objects thereof.

With the development of semiconductor technologies, users have put forward a huge demand for small size and integration of memory. As core components of the memory, capacitors are mainly configured to store electric charges. As volume of the memory shrinks, it becomes more and more difficult to achieve the same capacitance or increase a larger capacitance. As can be known from a capacitance formula $$C = \frac{K_{high K} \varepsilon_0 A}{t_{high K}} = \frac{3.9 \varepsilon_o A}{t_{eq}},$$

where A=2πr*h), when using materials with a same dielectric constant, to increase storage capacity of a capacitor may be implemented only by reducing a thickness of a dielectric layer and increasing a surface area of the capacitor. However, reducing the thickness of the dielectric layer may cause higher leakage current and lower product yield.

In related technologies, generally the storage capacity of the capacitor is increased by increasing the surface area of the capacitor. In the process of manufacturing the capacitor, it is required to form a support layer and a sacrificial layer overlapped with each other on a substrate; the support layer and the sacrificial layer are etched to form a porous structure have a high aspect ratio; and the sacrificial layer is removed after the capacitor is formed. However, due to limitation of fabrication technologies, etching depths of film layers are different in different etching regions during formation of the porous structure have a high aspect ratio. After the sacrificial layer is removed, a part of the capacitors fail due to floating, and this part of the capacitors are vulnerable to collapse, leading to lower device yield.

On this basis, the present disclosure provides a method for forming a semiconductor structure to solve the above technical problems. FIG. 1 illustrates a flowchart of a method for forming a semiconductor structure according to an embodiment of the present disclosure. Referring to FIG. 1, the method may include Steps S110 to S150:

Step S110: providing a substrate;

Step S120: forming a plurality of groups of support pillars spaced apart along a first direction in the substrate, each of the plurality of groups of support pillars being spaced apart along a second direction, the first direction intersecting with the second direction;

Step S130: forming a support layer filling up top gaps between adjacent two of the support pillars;

Step S140: forming an epitaxial pillar on a top of each of the support pillars respectively by means of an epitaxial growth process; and Step S150: forming a capacitor structure on a surface of a structure jointly constituted by each of the epitaxial pillars and each of the support pillars.

In the method for forming a semiconductor structure of the present disclosure, an epitaxial pillar may be grown on a support pillar by means of an epitaxial growth process, and then a capacitor structure may be formed on a surface of a structure jointly constituted by the support pillar and the epitaxial pillar. In this process, in one aspect, a height of the support pillar formed by means of initial etching may be appropriately reduced to avoid insufficient etching, such that the capacitor structure formed subsequently is not prone to floating. In another aspect, the support pillar has a lower height, which can prevent collapse of the support pillar, thereby preventing collapse of the capacitor structure formed thereon, and improving product yield. Furthermore, the capacitor structure may be supported by the support layer, which can further prevent collapse of the capacitor structure, thereby improving the product yield. In addition, by forming the epitaxial pillar on the support pillar by means of the epitaxial process, a height of a pillar body may be increased, such that the height of the capacitor structure formed on the surface of the epitaxial pillar is increased, to achieve the objective of increasing storage capacity of the capacitor.

The steps of the method for forming a semiconductor structure according to the embodiments of the present disclosure are described in detail below.

As shown in FIG. 1, in Step S110, a substrate is provided.

Figure 2:
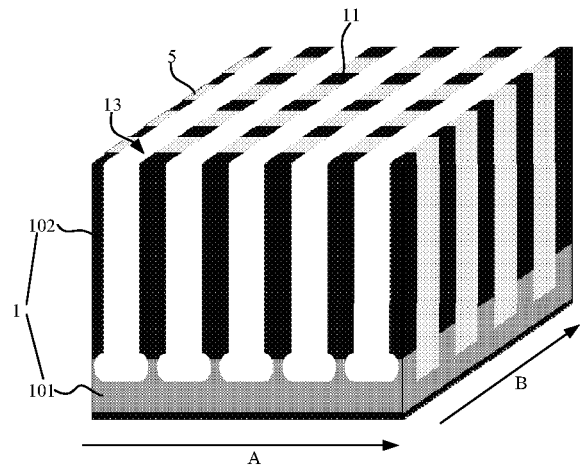
FIG. 2 is a schematic structural diagram after Step S120 is completed according to an embodiment of the present disclosure.

As shown in FIG. 2, the substrate 1 may have a flat plate structure, which may be rectangular, circular, elliptical, polygonal or irregular, and a material of the substrate 1 may be silicon or other semiconductor materials. The shape and the material of the substrate 1 are not limited here.

The substrate 1 may include a base substrate (not shown in the figure) and an insulating layer (not shown in the figure) formed on the base substrate, and a plurality of conductive contact plugs (not shown in the figure) distributed side by side are formed in the insulating layer. The plurality of conductive contact plugs may be separated from each other by the insulating layer to avoid occurrence of coupling between the plurality of conductive contact plugs or generation of parasitic capacitance. Each of the plurality of conductive contact plugs may be made from conductor or semiconductor material, which may be, for example, tungsten, copper, or polysilicon, etc.

For example, a plurality of via holes distributed in an array may be arranged in the insulating layer, each of the plurality of via holes may be a through hole, and each of the plurality of conductive contact plugs may be formed in each of the plurality of via holes. For example, each of the plurality of conductive contact plugs may be formed in each of the plurality of via holes by means of vacuum evaporation, magnetron sputtering, chemical vapor deposition, physical vapor deposition, or atomic layer deposition, etc. Of course, the plurality of conductive contact plugs may also be formed by other means, which are not to be enumerated here.

The present disclosure may include a plurality of groups of conductive contact plugs spaced apart along the first direction A. For example, each of the plurality of groups of conductive contact plugs may be uniformly spaced apart along the first direction A; and the plurality of groups of conductive contact plugs may be spaced apart along the second direction B. For example, each of the plurality of groups of conductive contact plugs may be uniformly spaced apart along the second direction B. The first direction A and the second direction B may be perpendicular to each other. That is, each of the plurality of conductive contact plugs may be distributed in an array in the form of rows and columns.

It is to be noted that the perpendicular may be absolutely perpendicular or approximately perpendicular, because deviations are unavoidable in the manufacturing process. In the present disclosure, deviation of an angle may be caused by limitations on fabrication technologies, such that there is a certain deviation of an angle between the first direction A and the second direction B. However, it may be considered that the first direction A is perpendicular to the second direction B as long as the deviation of the angle between the first direction A and the second direction B is within a preset range. For example, the preset range may be 10°. That is, when the angle between the first direction A and the second direction B is within a range of greater than or equal to 80° and less than or equal to 100°, it may be considered that the first direction A is perpendicular to the second direction B.

In one embodiment, the substrate 1 may be internally provided with a shallow trench isolation structure (not shown in the figure) and a bit line structure (not shown in the figure). The shallow trench isolation structure may divide the substrate 1 into a plurality of active areas, the bit line structure and each of the plurality of conductive contact plugs are positioned on top of each of the plurality of active areas, and the bit line structure is alternately arranged with each of the plurality of conductive contact plugs in the substrate 1.

As shown in FIG. 1, in Step S120, a plurality of groups of support pillars spaced apart along a first direction are formed in the substrate, and each of the plurality of groups of support pillars are spaced apart along a second direction, where the first direction intersects with the second direction.

As shown in FIG. 2, a plurality of support pillars 11 are formed in the substrate 1 by means of an etching process. In the present disclosure, a plurality of groups of support pillars 11 spaced apart along the first direction A may be formed in the substrate 1. For example, each of the plurality of groups of support pillars 11 may be uniformly spaced apart along the first direction A; and the plurality of groups of support pillars 11 may be spaced apart along the second direction B. For example, each of the plurality of groups of support pillars 11 may be uniformly spaced apart along the second direction B. The first direction A and the second direction B may be different directions. For example, the first direction A may intersect with the second direction B. For example, the first direction A and the second direction B may be perpendicular to each other. That is, the plurality of groups of support pillars 11 may be distributed in an array in the form of rows and columns.

Figure 3:
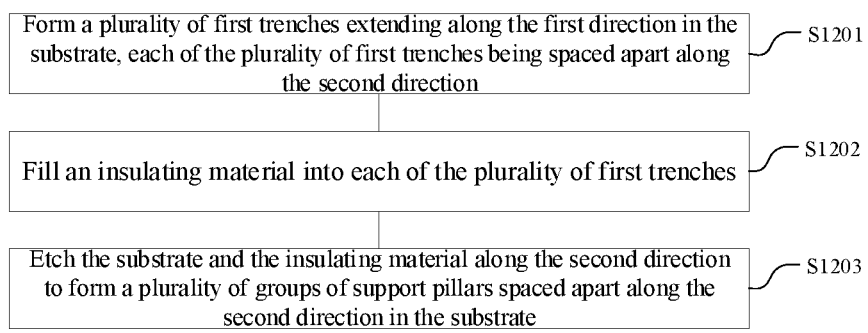
FIG. 3 is a flowchart of Step S120 according to an embodiment of the present disclosure.

In an exemplary embodiment of the present disclosure, a plurality of groups of support pillars 11 spaced apart along a first direction A are formed in the substrate 1, and each of the plurality of groups of support pillars 11 are spaced apart along a second direction B, where the first direction A intersects with the second direction B. That is, Step S120 may include Steps S1201 to S1203. FIG. 3 illustrates a flowchart of Step S120 according to an embodiment of the present disclosure. Referring to FIG. 3, wherein:

Step S1201: forming a plurality of first trenches extending along the first direction in the substrate, each of the plurality of first trenches being spaced apart along the second direction.

Figure 4:
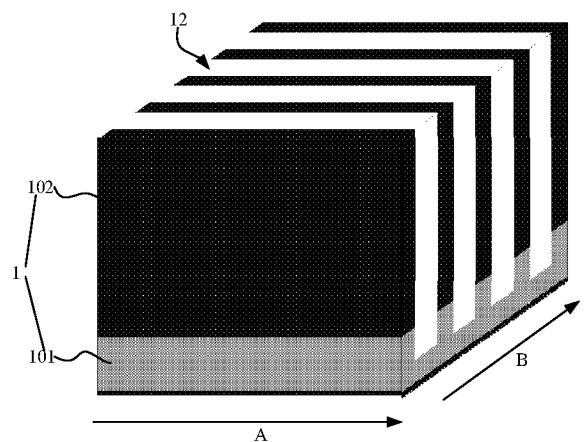
FIG. 4 is a schematic structural diagram after Step S1201 is completed according to an embodiment of the present disclosure.

As shown in FIG. 4, a plurality of first trenches 12 may be form in the substrate 1 by means of a photolithography process, where each of the plurality of first trenches 12 may extend along the first direction A, and the plurality of first trenches 12 may be spaced apart along the second direction B. For example, a photoresist layer may be formed on a surface of the substrate 1 by means of spin coating or by other means, where a material of the photoresist layer may be positive photoresist or negative photoresist, which is not limited herein. A shape of the photoresist layer far away from the surface of the substrate 1 may be the same as that of the surface of the substrate 1. The photoresist layer may be exposed by means of a mask, where a pattern of the mask may be matched to a desired pattern of each of the plurality of first trenches 12. Subsequently, the exposed photoresist layer may be developed to form a development region, which can expose the substrate 1. A pattern of the development region may be the same as the desired pattern of each of the plurality of first trenches 12, and a size of the development region may be the same as that desired by each of the plurality of first trenches 12. Anisotropic etching may be performed on the substrate 1 in the development region to expose each of the plurality of conductive contact plugs corresponding to each of the plurality of first trenches 12. In this embodiment of the present disclosure, a structure obtained after Step S1201 is completed is as shown in FIG. 4.

Step S1202: filling an insulating material into each of the plurality of first trenches.

Figure 5:
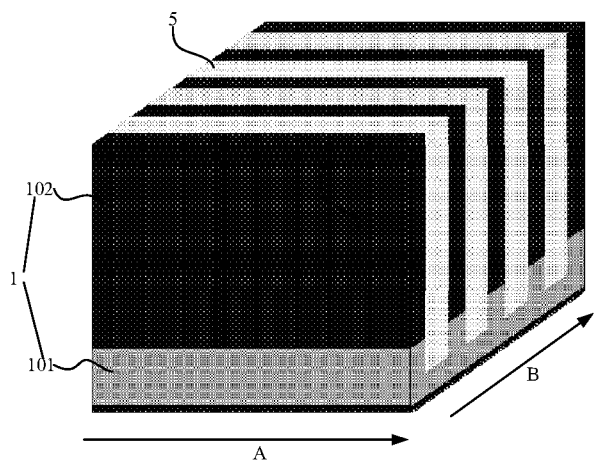
FIG. 5 is a schematic structural diagram after Step S1202 is completed according to an embodiment of the present disclosure.

An insulating material 5 may be filled into each of the plurality of first trenches 12 by means of vacuum evaporation, magnetron sputtering, chemical vapor deposition, physical vapor deposition or atomic layer deposition and so on, where the insulating material 5 may fill up each of the plurality of first trenches 12 entirely. In one embodiment, the insulating material 5 may be an oxide, for example, silicon oxide. In this embodiment of the present disclosure, a structure obtained after Step S1202 is completed is as shown in FIG. 5.

Step S1203: etching the substrate and the insulating material along the second direction to form a plurality of groups of support pillars spaced apart along the second direction in the substrate.

The insulating material 5 in the substrate 1 and each of the plurality of first trenches 12 may be etched along the second direction B by means of an etching process, to form each of the plurality of groups of support pillars 11 in the substrate 1. For example, the substrate 1 and the insulating material 5 are etched along the second direction B by means of a Bosch etch process to form a plurality of second trenches 13 spaced apart along the first direction A, where a bottom size of each of the plurality of second trenches 13 may be greater than a pitch between adjacent two of the support pillars 11, to reduce direct contact between a capacitor structure formed subsequently and the substrate 1 and reduce current leakage. The support pillars 11 and the substrate 1 may be made from the same material, for example, single crystal silicon. A height of the support pillar 11 may be 50 nm to 100 nm. For example, the height of the support pillar 11 may be 50 nm, 60 nm, 70 nm, 80 nm, 90 nm or 100 nm. Of course, other heights are also permissible, which are not enumerated one by one here.

In this process, each of the plurality of second trenches 13 may be formed by means of stepwise etching, and a protective layer may be formed on a surface of a sidewall of a trench-like structure formed by each etching. In some embodiments, the substrate 1 and the insulating material 5 may be etched for multiple times by means of sulfur hexafluoride plasma, where one trench-like structure may be formed during each etching. In the process of next etching, bottom of the trench-like structure formed by previous etching may be further etched to extend a depth of the trench-like structure, thereby forming each of the plurality of second trenches 13. It is to be noted that after each etching is completed, a protective layer may be formed on the surface of the trench-like structure by means of $C_4F_8$ plasma, thereby avoiding damage to a sidewall of the trench-like structure formed by the previous etching during the next etching. Furthermore, after the last etching, there is no need to form the protective layer at the bottom of the trench-like structure. In this embodiment of the present disclosure, a structure obtained after Step S1203 is completed is as shown in FIG. 2.

In an exemplary embodiment of the present disclosure, the substrate 1 may include a first doped region 101 and a second doped region 102 distributed adjacently and stacked along a thickness direction, where the first doped region 101 is the same as the second doped region 102 in shape, and an edge of an orthographic projection of the second doped region 102 on the first doped region 101 is overlapped with an edge of the first doped region 101. The method of the present disclosure may further include Steps S210 and S220.

Step S210: performing P-type doping on the first doped region.

P-type doping may be performed on the substrate 1 by means of ion implantation. For example, P-type doped material may be doped into the first doped region 101 to form a P-type semiconductor in the first doped region 101.

In an exemplary embodiment of the present disclosure, the P-type doped material may be an element in main group III in Periodic Table of the Elements, for example, boron. Of course, the P-type doped material may also be materials of other elements, which are not to be enumerated one by one here.

In an exemplary embodiment of the present disclosure, each of the plurality of conductive contact plugs may be positioned in the first doped region 101, and each of the plurality of conductive contact plugs may be distributed in an array in the first doped region 101.

Step S220: performing N-type doping on the second doped region, the support pillars being positioned in the second doped region and being in contact connection to the first doped region.

N-type doping may be performed on the substrate 1 by means of ion implantation, to form a P-N junction in the substrate 1. For example, N-type doped material may be doped into the second doped region 102 to form an N-type semiconductor in the second doped region 102. The P-type semiconductor in the first doped region 101 and the N-type semiconductor in the second doped region 102 may form the P-N junction.

In an exemplary embodiment of the present disclosure, the N-type doped material may be an element in main group IV in Periodic Table of the Elements, for example, phosphorus. Of course, the N-type doped material may also be materials of other elements, which are not to be enumerated one by one here.

In an exemplary embodiment of the present disclosure, the support pillars 11 may be positioned in the second doped region 102, and an end of each of the support pillars 11 close to the first doped region 101 may be in contact connection with the first doped region 101. That is, the support pillars 11 may be N-type semiconductors, a P-N junction may be formed between each of the support pillars 11 and the first doped region 101, and current leakage may be reduced by means of a depletion region of the P-N junction.

In an exemplary embodiment of the present disclosure, a given one of the plurality of second trenches 13 may extend into the first doped region 101, and a size of a part of the given second trench 13 extending into the first doped region 101 in the first direction A is greater than a pitch between adjacent two of the support pillars 11. A bottom size of the given second trench 13 is greater than the pitch between adjacent two of the support pillars 11, which can reduce the direct contact between a capacitor structure subsequently formed in the given second trench 13 and the substrate 1. Furthermore, current leakage may be reduced by means of the P-N junction, to improve product yield.

As shown in FIG. 1, a support layer filling up top gaps between adjacent two of the support pillars is formed in Step S130.

In an exemplary embodiment of the present disclosure, the support layer 2 may include a first extended portion 21 and a second extended portion 22, and the first extended portion 21 and the second extended portion 22 may be filled into an end of each of the support pillars 11 facing away from the first extended portion 21. For example, the first extended portion 21 may fill up the top gaps between the support pillars 11 spaced apart along the first direction A, and the first extended portion 21 can provide, in the first direction A, transverse support to the support pillars 11 spaced apart along the first direction A, to prevent collapse of the support pillars 11. The second extended portion 22 may fill up the top gaps between the support pillars 11 spaced apart along the second direction B, and the second extended portion 22 can provide, in the second direction B, transverse support to the support pillars 11 spaced apart along the second direction B, to further prevent collapse of the support pillars 11.

Figure 6:
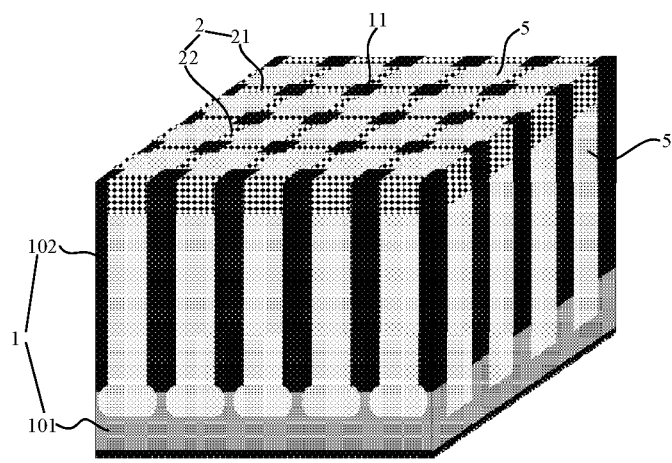
FIG. 6 is a schematic structural diagram after Step S130 is completed according to an embodiment of the present disclosure.

In an exemplary embodiment of the present disclosure, the thickness of each of the support layers 2 may be 10 nm to 50 nm. For example, the thickness of each of the support layers 2 may be 10 nm, 20 nm, 30 nm, 40 nm or 50 nm. Of course, other thicknesses may also be permissible, which are not to be enumerated one by one here. In this embodiment of the present disclosure, a structure obtained after Step S130 is completed is as shown in FIG. 6.

Figure 7:
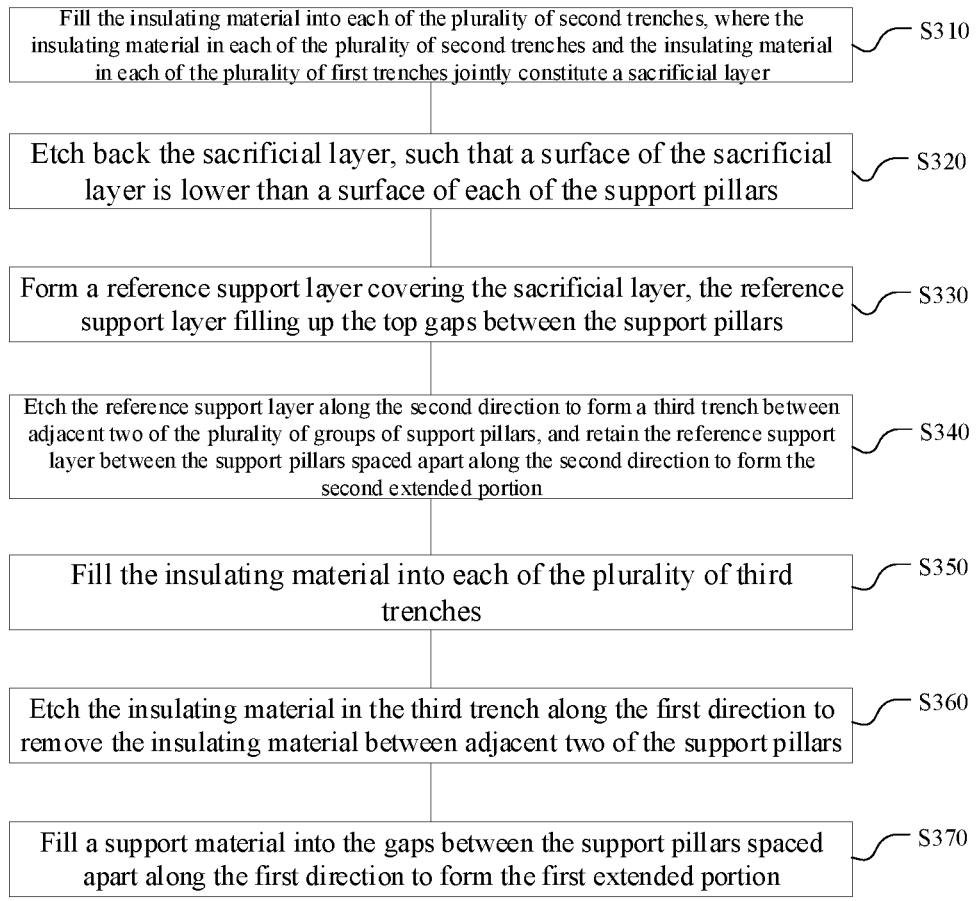
FIG. 7 is a flowchart of forming a first extended portion and a second extended portion according to an embodiment of the present disclosure.

In an exemplary embodiment of the present disclosure, forming the first extended portion 21 and the second extended portion 22 includes Steps S310 to S370. FIG. 7 illustrates a schematic diagram of forming the first extended portion 21 and the second extended portion 22 according to an embodiment of the present disclosure. Referring to FIG. 7, wherein:

Step S310: filling the insulating material into each of the plurality of second trenches, where the insulating material in each of the plurality of second trenches and the insulating material in each of the plurality of first trenches jointly constitute a sacrificial layer.

The insulating material 5 may be filled into each of the plurality of second trenches 13 by means of vacuum evaporation, magnetron sputtering, chemical vapor deposition, physical vapor deposition or atomic layer deposition, etc. Of course, the insulating material 5 may be filled into each of the plurality of second trenches 13 by other means, and no special limitation is imposed on manners of filling the insulating material 5 here.

In one embodiment, the insulating material 5 may fill up each of the plurality of second trenches 13, such that the insulating material 5 in each of the plurality of first trenches 12 is flush with a top surface of the insulating material 5 in each of the plurality of second trenches 13. The insulating material 5 positioned in each of the plurality of second trenches 13 and the insulating material 5 positioned in each of the plurality of first trenches 12 may jointly constitute a sacrificial layer. The insulating material 5 filled in each of the plurality of second trenches 13 may be the same as the insulating material 5 filled in each of the plurality of first trenches 12. For example, the insulating material 5 may be silicon oxide.

Figure 8:
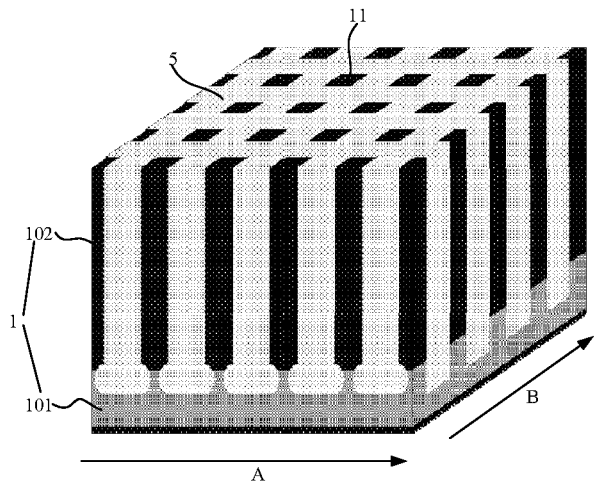
FIG. 8 is a schematic structural diagram after Step S310 is completed according to an embodiment of the present disclosure.

It is to be noted that for the convenience of process, the insulating material 5 may be synchronously deposited on the surface of each of the support pillars 11, and the filling may be stopped after the insulating material 5 positioned in each of the plurality of second trenches 13 fills up the gaps between the support pillars 11. Next, the insulating material 5 deposited on the surface of each of the support pillars 11 may be polished by means of a chemical polishing process, such that the insulating material 5 positioned on the surface of each of the support pillars 11 is removed, and only the insulating material 5 positioned in each of the plurality of second trenches 13 is retained. In this embodiment of the present disclosure, a structure obtained after Step S310 is completed is as shown in FIG. 8.

Step S320: etching back the sacrificial layer, such that a surface of the sacrificial layer is lower than a surface of each of the support pillars.

In one embodiment, the sacrificial layer may be etched back by means of a wet etching process, such that the surface of the sacrificial layer is lower than the top surface of each of the support pillars 11. For example, the wet etching may be performed using an acidic solution such as hydrofluoric acid, which may be, for example, buffered hydrofluoric acid (BHF), hydrofluoric acid having a concentration of 49%, or diluted hydrofluoric acid (DHF). When the DHF is used as an etching solution, a preparation ratio of the hydrofluoric acid to deionized water may be 1:1 to 1:10, and no special limitation is imposed on the proportion or the concentration of the etching solution here. Of course, the surface of the sacrificial layer may also be etched back by means of a dry etching process as long as the surface of the sacrificial layer can be lower than the surface of each of the support pillars 11 by a first preset height, and no special limitation is imposed on the process of etching back the sacrificial layer here.

Figure 9:
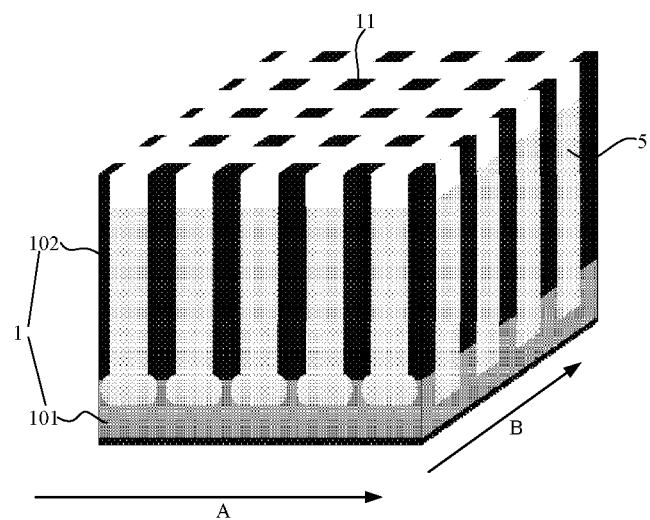
FIG. 9 is a schematic structural diagram after Step S320 is completed according to an embodiment of the present disclosure.

In an exemplary embodiment of the present disclosure, the first preset height may be 10 nm to 50 nm. For example, the first preset height may be 10 nm, 20 nm, 30 nm, 40 nm or 50 nm. Of course, the first preset height may also be other heights, which are not to be enumerated one by one here. In this embodiment of the present disclosure, a structure obtained after Step S320 is completed is as shown in FIG. 9.

Step S330: forming a reference support layer covering the sacrificial layer, the reference support layer filling up the top gaps between the support pillars.

A support material may be deposited on the surface of the sacrificial layer by means of vacuum evaporation, magnetron sputtering, chemical vapor deposition, physical vapor deposition or atomic layer deposition and so on, to form a reference support layer 200 covering the sacrificial layer, where the reference support layer 200 may fill up the top gaps between the support pillars 11. In one embodiment, the support material may be silicon nitride.

Figure 10:
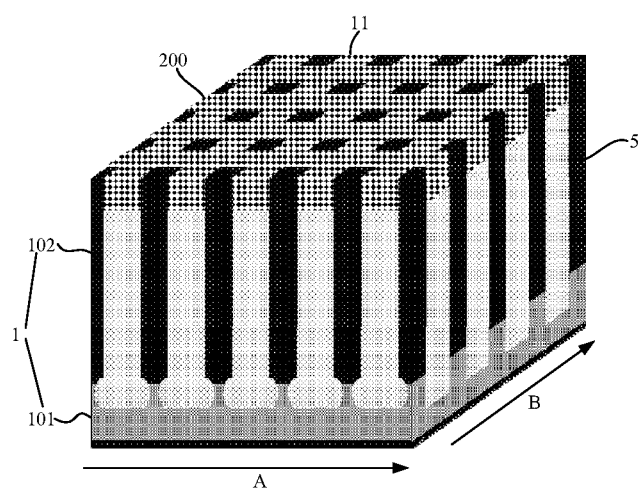
FIG. 10 is a schematic structural diagram after Step S330 is completed according to an embodiment of the present disclosure.

It is to be noted that for the convenience of process, the support material may be deposited on the surface of the support pillars 11 synchronously, and the filling may be stopped after the support material positioned on the surface of the sacrificial layer fills up the gaps between the support pillars 11. Next, the support material deposited on the surface of each of the support pillars 11 is polished by means of a chemical polishing process, such that the support material positioned on the surface of each of the support pillars 11 is removed, and only the support material positioned on the surface of the sacrificial layer is retained. In this way, the reference support layer 200 is formed on the surface of the sacrificial layer. In this embodiment of the present disclosure, a structure obtained after Step S330 is completed is as shown in FIG. 10.

Step S340: etching the reference support layer along the second direction to form a third trench between adjacent two of the plurality of groups of support pillars, and retaining the reference support layer between the support pillars spaced apart along the second direction to form the second extended portion.

A plurality of third trenches 14 may be formed in the reference support layer 200, the plurality of third trenches 14 may extend along the second direction B, and the plurality of third trenches 14 may be spaced apart along the first direction A. Each of the plurality of groups of support pillars 11 spaced apart along the first direction A may be alternately arranged with each of the plurality of third trenches 14 along the first direction A. A depth of each of the plurality of third trenches 14 may be the same as a thickness of the reference support layer 200. That is, each of the plurality of third trenches 14 may penetrate through the reference support layer 200 in the thickness direction.

Figure 11:
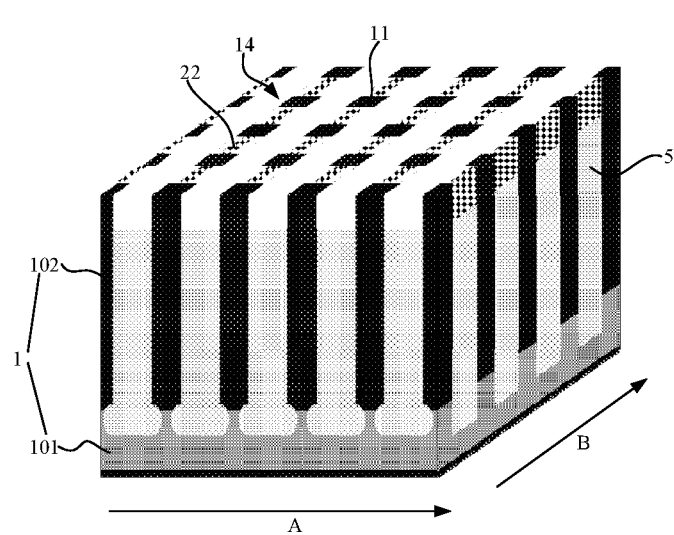
FIG. 11 is a schematic structural diagram after Step S340 is completed according to an embodiment of the present disclosure.

In an exemplary embodiment of the present disclosure, a photoresist layer may be formed on the surface of the reference support layer 200 by means of spin coating or by other means. A material of the photoresist layer may be positive photoresist or negative photoresist, and no special restrictions are imposed here. The photoresist layer may be exposed by means of a mask, where a pattern of the mask may be matched to a desired pattern of each of the plurality of third trenches 14. Subsequently, the exposed photoresist layer may be developed to form a plurality of development regions, where each of the plurality of development regions may expose the reference support layer 200, and a pattern of each of the plurality of development regions may be the same as the desired pattern of each of the plurality of third trenches 14, and a width of each of the plurality of development regions may be equal to that required for each of the plurality of third trenches 14. The reference support layer 200 may be etched in each of the plurality of development regions to form each of the plurality of third trenches 14 exposing the sacrificial layer. In this embodiment of the present disclosure, a structure obtained after Step S340 is completed is as shown in FIG. 11.

It is to be noted that in the process of forming each of the plurality of third trenches 14, the reference support layer 200 covered by the photoresist layer may be retained, where this part of the reference support layer 200 is positioned between the support pillars 11 spaced apart along the second direction B, and the reference support layer 200 retained during this etching is defined as the second extended portion 22. After each of the plurality of third trenches 14 is formed, the photoresist layer may be removed by means of ashing or other processes, such that the second extended portion 22 formed by etching can be exposed.

Step S350: filling the insulating material into each of the plurality of third trenches.

The insulating material 5 may be filled into each of the plurality of third trenches 14 by means of vacuum evaporation, magnetron sputtering, chemical vapor deposition, physical vapor deposition or atomic layer deposition and so on. Of course, the insulating material 5 may be filled into each of the plurality of third trenches 14 by other means, and no special limitation is imposed on manners of filling the insulating material 5 here.

In one embodiment, the insulating material 5 may fill up each of the plurality of third trenches 14, such that the insulating material 5 in each of the plurality of third trenches 14 is flush with the second extending portion 22 and the surface of each of the support pillars 11. The insulating material 5 filled into each of the plurality of third trenches 14 may be the same as the insulating material 5 filled into each of the plurality of first trenches 12 and each of the plurality of second trenches 13. For example, the insulating material 5 may be silicon oxide.

Figure 12:
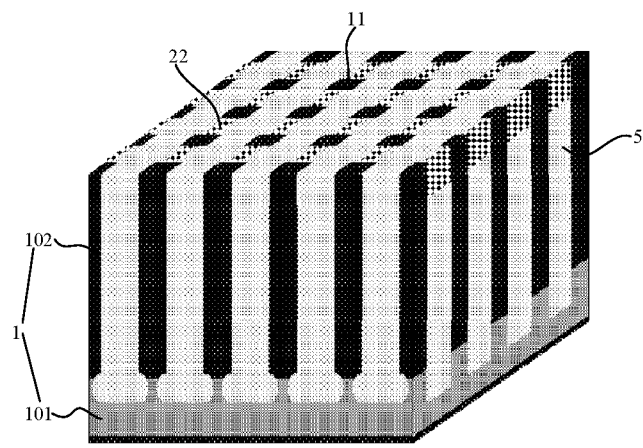
FIG. 12 is a schematic structural diagram after Step S350 is completed according to an embodiment of the present disclosure.

It is to be noted that for the convenience of process, the insulating material 5 may be deposited on the surface of each of the support pillars 11 synchronously, and the filling may be stopped after the insulating material 5 in each of the plurality of third trenches 14 fills up the gaps between the support pillars 11. Next, the insulating material 5 deposited on the surface of each of the support pillars 11 is polished by means of a chemical polishing process, such that the insulating material 5 positioned on the surface of each of the support pillars 11 is removed, and only the insulating material 5 in each of the plurality of third trenches 14 is retained. In this embodiment of the present disclosure, a structure obtained after Step S350 is completed is as shown in FIG. 12.

Step S360: etching the insulating material in each of the plurality of third trenches along the first direction to remove the insulating material between adjacent two of the support pillars.

The insulating material 5 between the support pillars 11 spaced apart along the first direction A may be removed by means of an etching process, thereby forming a fourth trench 15, where the fourth trench 15 may include a plurality of isolation trenches 1501 spaced apart. In the first direction A, each of the plurality of isolation trenches 1501 may be distributed adjacent to and alternately arranged with each of the support pillars 11.

For example, a photoresist layer may be formed on a surface of a structure jointly constituted by the insulating material 5 and each of the support pillars 11 by means of spin coating or by other means, where a material of the photoresist layer may be positive photoresist or negative photoresist, and no special limitation is imposed here. A shape of the photoresist layer far away from the surface of the substrate 1 may be the same as that of the surface of the substrate 1. The photoresist layer may be exposed by means of a mask, where a pattern of the mask may be matched to a desired pattern of each of the plurality of fourth trenches 15. Subsequently, the exposed photoresist layer may be developed to form a development region, which can expose the insulating material 5 between the support pillars 11 spaced apart along the first direction A. A pattern of the development region may be the same as the desired pattern of each of the plurality of fourth trenches 15, and a size of the development region may be the same as that desired by each of the plurality of fourth trenches 15. The insulating material 5 may be selectively etched in the development region to form each of the plurality of fourth trenches 15, which may expose the sacrificial layer etched back.

Figure 13:
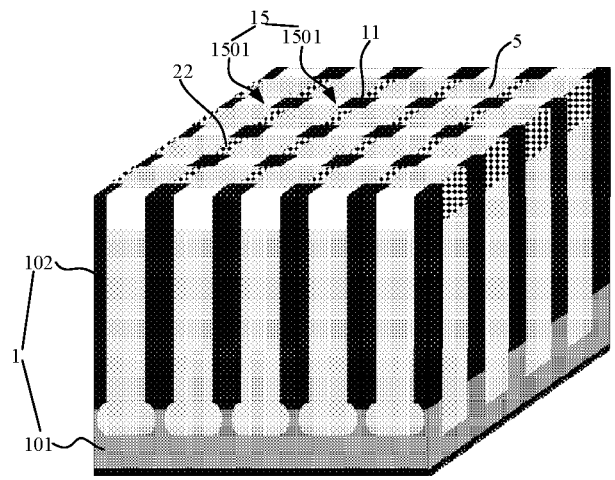
FIG. 13 is a schematic structural diagram after Step S360 is completed according to an embodiment of the present disclosure.

It is to be noted that after each of the plurality of fourth trenches 15 is formed, the photoresist layer may be removed by means of ashing or by means of other processes. In this embodiment of the present disclosure, a structure obtained after Step S360 is completed is as shown in FIG. 13.

Step S370: filling a support material into the gaps between the support pillars spaced apart along the first direction to form the first extended portion.

The support material may be filled into each of the plurality of fourth trenches 15 to form the first extended portion 21. For example, the insulating material 5 may be filled into each of the plurality of fourth trenches 15 by means of vacuum evaporation, magnetron sputtering, chemical vapor deposition, physical vapor deposition or atomic layer deposition and so on. Of course, the insulating material 5 may also be filled into each of the plurality of fourth trenches 15 by other means, and no special limitation is imposed on manners of filling the insulating material here.

In one embodiment, the support material may fill up each of the plurality of fourth trenches 15, such that the support material in each of the plurality of fourth trenches 15 is flush with the second extended portion 22 and the surface of each of the support pillars 11. The support material filled into each of the plurality of fourth trenches 15 may be the same as the material of the second extended portion 22, which may be, for example, silicon nitride.

Figure 14:
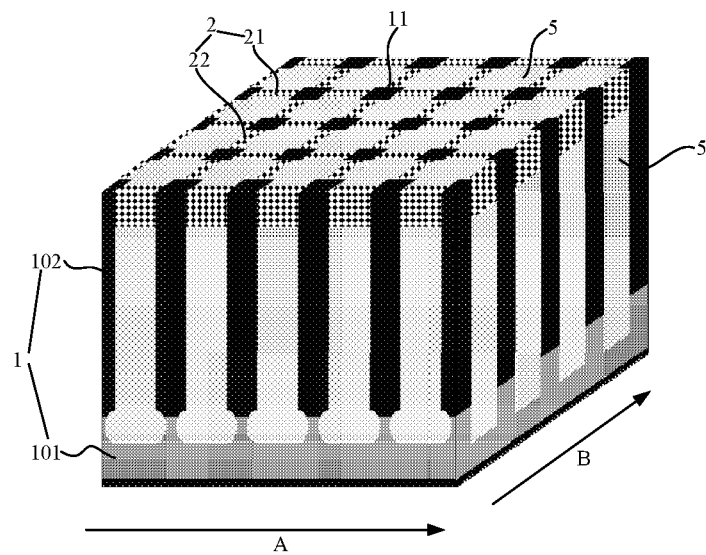
FIG. 14 is a schematic structural diagram after Step S370 is completed according to an embodiment of the present disclosure.

It is to be noted that for the convenience of process, the support material may be synchronously deposited on the surface of the insulating material 5 filled into each of the support pillars 11, the first extended portion 21, and each of the plurality of third trenches 14. The deposition may be stopped after the support material in each of the plurality of fourth trenches 15 fills up the gaps between the support pillars 11. Next, the support material deposited on the surface of the insulating material 5 filled into each of the support pillars 11, the first extended portion 21 and each of the plurality of third trenches 14 is polished by means of a chemical polishing process, such that the support material positioned on the surface of the insulating material 5 filled into each of the support pillars 11, the first extended portion 21 and each of the plurality of third trenches 14 is removed, and only the support material in each of the plurality of fourth trenches 15 is retained. In this way, the first extended portion 21 is formed in each of the plurality of fourth trenches 15. In this embodiment of the present disclosure, a structure obtained after Step S370 is completed is as shown in FIG. 14.

As shown in FIG. 1, in Step S140, an epitaxial pillar is formed on a top of each of the support pillars respectively by means of an epitaxial growth process.

Figure 15:
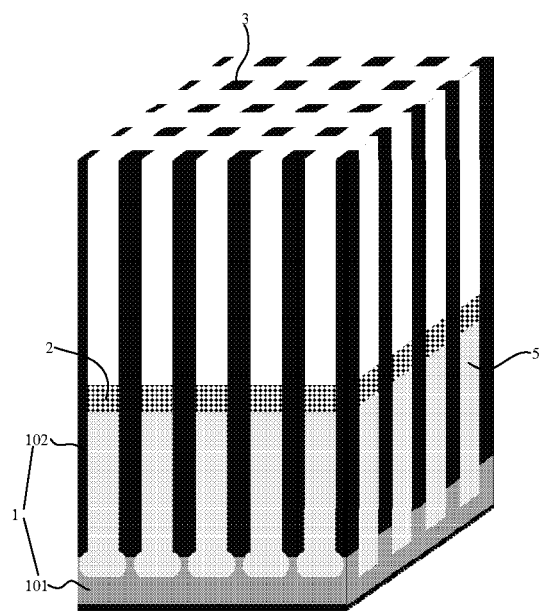
FIG. 15 is a schematic structural diagram after Step S140 is completed according to an embodiment of the present disclosure.
Figure 16:
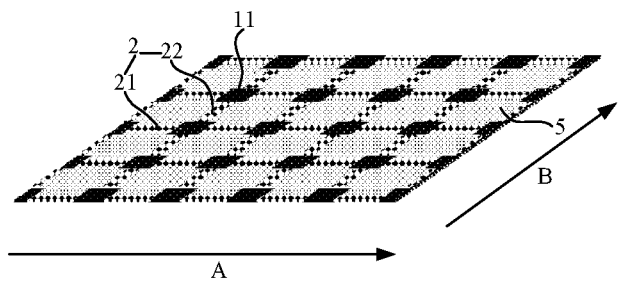
FIG. 16 is a vertical view of a structure obtained after Step S140 is completed according to an embodiment of the present disclosure.

Epitaxial growth of single crystal silicon may be performed on the top of each of the support pillars 11 by means of the epitaxial growth process. During this process, limited by the insulating material 5 and the support material, during the process of epitaxial growth, a single crystal silicon film layer is not to be formed on the surface of the insulating material 5 and the support material, instead only a single crystal film layer is formed on the top of each of the support pillars 11. In the above process, a height of a pillar body may be increased, such that the height of the capacitor structure formed on the surface of the epitaxial pillar is increased, to achieve the objective of increasing storage capacity of the capacitor. In addition, the etching process may be avoided, such that the problem of insufficient etching may be avoided, and the product yield may be improved. In this embodiment of the present disclosure, a structure obtained after Step S140 is completed is as shown in FIG. 15 and FIG. 16.

In an exemplary embodiment of the present disclosure, a ratio of a height of the epitaxial pillar 3 to a height of the support pillar 11 may be one third to five thirds. For example, the height of the epitaxial pillar 3 may be the same as the height of each of the support pillars 11, or the height of the epitaxial pillar 3 may be one third, two thirds, four thirds or five thirds of the height of each of the support pillars 11. Of course, the epitaxial pillar 3 may also have other heights, which are not to be enumerated one by one here.

As shown in FIG. 1, in Step S150, a capacitor structure is formed on a surface of a structure jointly constituted by each of the epitaxial pillars and each of the support pillars.

A capacitor structure 4 conformally attached on a sidewall surface of each of the epitaxial pillars 3 and each of the support pillars 11 may be formed on a sidewall of the structure jointly constituted by each of the epitaxial pillars 3 and each of the support pillars 11. An orthographic projection of the capacitor structure 4 on the first doped region 101 may be at least partially overlapped with each of the plurality of conductive contact plugs in the first doped region 101, such that the capacitor structure 4 may be in contact connection with each of the plurality of conductive contact plugs, to store charges collected by the capacitor structure 4 through each of the plurality of conductive contact plugs.

Figure 17:
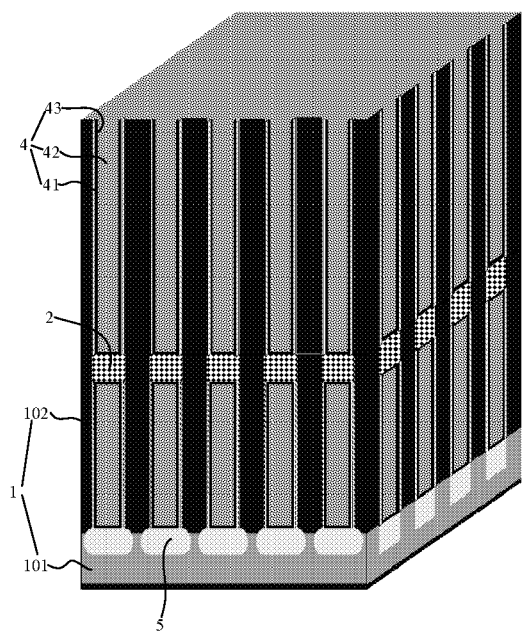
FIG. 17 is a schematic structural diagram after Step S150 is completed according to an embodiment of the present disclosure.

For example, the capacitor structure 4 may be formed on the sidewall of the structure jointly constituted by each of the epitaxial pillars 3 and each of the support pillars 11 by means of vacuum evaporation, magnetron sputtering, chemical vapor deposition, physical vapor deposition or atomic layer deposition, etc. Of course, the capacitor structure 4 may also be formed by means of other processes, and no special limitation is imposed on processes of forming the capacitor structure 4 here. In this embodiment of the present disclosure, a structure obtained after Step S150 is completed is as shown in FIG. 17.

In an exemplary embodiment of the present disclosure, the method of the present disclosure may further include:

Step S160: removing the sacrificial layer and the insulating material positioned in the second doped region before the capacitor structure is formed on the surface of the structure jointly constituted by each of the epitaxial pillars and each of the support pillars.

Before forming the capacitor structure 4, the sacrificial layer and the insulating material 5 filled between the support pillars 11 may be removed, such that the sidewall of each of the support pillars 11 is exposed, to facilitate synchronous formation of the capacitor structure 4 on the sidewall of each of the epitaxial pillars 3 and each of the support pillars 11, which is advantageous to increasing the height of the capacitor structure 4 and improving the storage capacity.

It is to be noted that in the above process, the sacrificial layer positioned in the first doped region 101 may be retained. A size of the sacrificial layer in each of the plurality of second trenches 13 on the first doped region 101 in the first direction A is greater than a pitch between adjacent two of the support pillars 11. Therefore, current leakage can be reduced by reducing contact between the substrate 1 and each of the support pillars 11 by means of the sacrificial layer in coordination with the depletion region of the P-N junction formed between the first doped region 101 and the second doped region 102.

Figure 18:
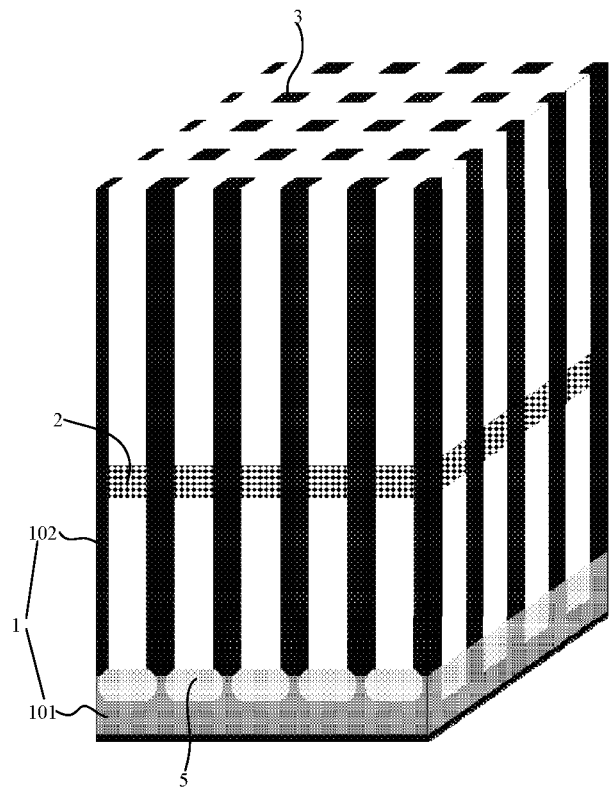
FIG. 18 is a schematic structural diagram after Step S160 is completed according to an embodiment of the present disclosure.
Figure 19:
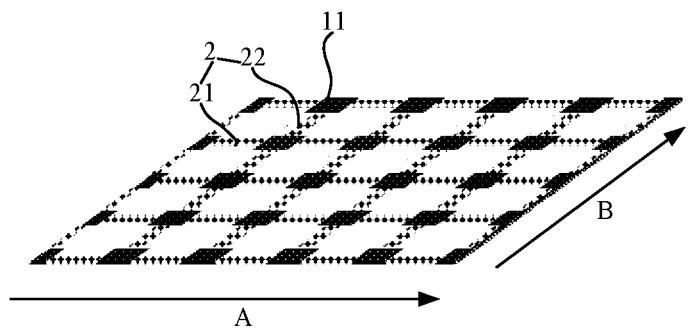
FIG. 19 is a vertical view of a structure obtained after Step S160 is completed according to an embodiment of the present disclosure.

For example, the sacrificial layer and the insulating material 5 may be removed by means of a wet etching process. For example, the wet etching may be performed using an acidic solution such as hydrofluoric acid, which may be, for example, buffered hydrofluoric acid (BHF), hydrofluoric acid having a concentration of 49%, or diluted hydrofluoric acid (DHF). When the DHF is used as an etching solution, a preparation ratio of the hydrofluoric acid to deionized water may be 1:1 to 1:10, and no special limitation is imposed on the proportion or the concentration of the etching solution here. In this embodiment of the present disclosure, a structure obtained after Step S160 is completed is as shown in FIG. 18 and FIG. 19.

Figure 20:
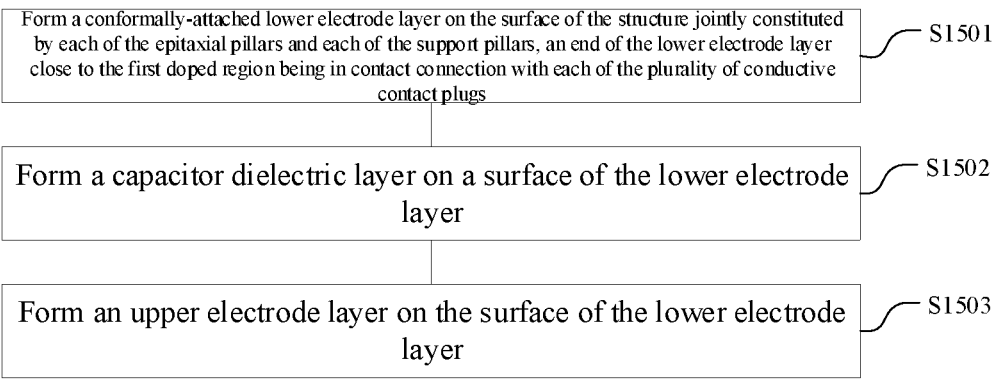
FIG. 20 is a flowchart of Step S150 according to an embodiment of the present disclosure.

In an exemplary embodiment of the present disclosure, the capacitor structure 4 may include a lower electrode layer 41, a capacitor dielectric layer 42, and an upper electrode layer 43. After removing the sacrificial layer and the insulating material 5 in the second doped region 102, the capacitor structure 4 is formed on the surface of the structure jointly constituted by each of the epitaxial pillars 3 and each of the support pillars 11. That is, Step S150 may include Steps S1501 to S1503. FIG. 20 illustrates a flowchart of Step S150 according to an embodiment of the present disclosure. Referring to FIG. 20:

Step S1501: forming a conformally-attached lower electrode layer on the surface of the structure jointly constituted by each of the epitaxial pillars and each of the support pillars, an end of the lower electrode layer close to the first doped region being in contact connection with each of the plurality of conductive contact plugs.

Figure 21:
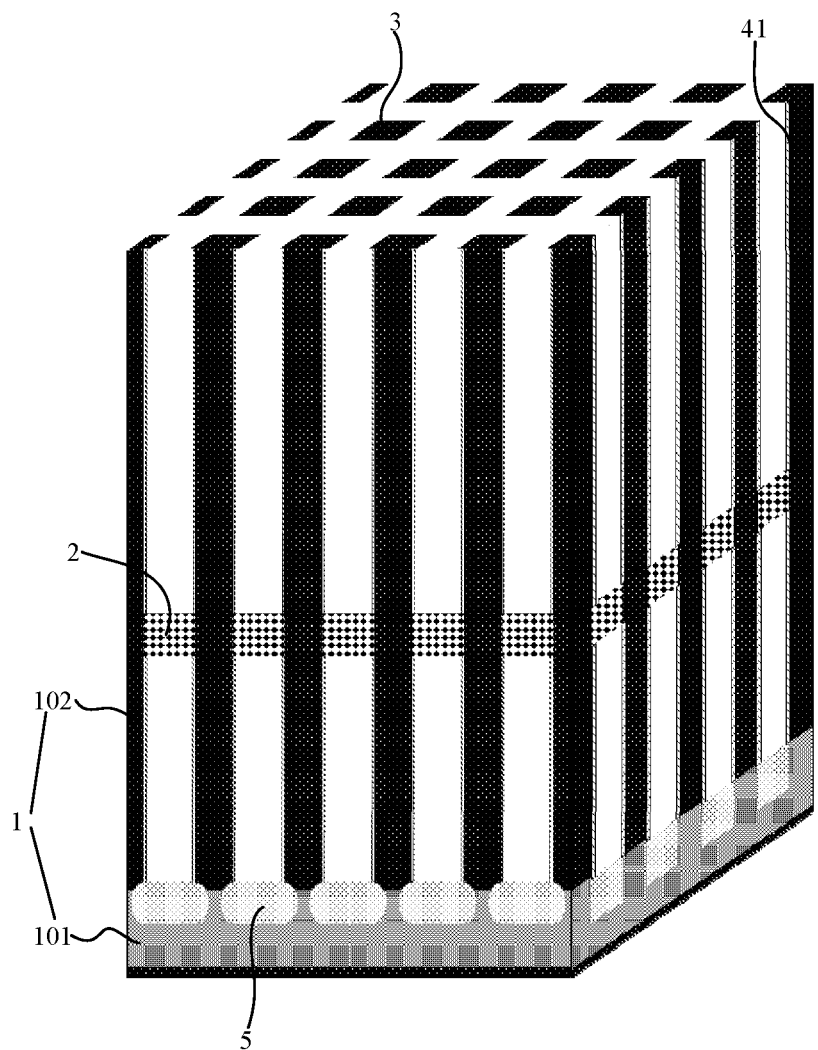
FIG. 21 is a schematic structural diagram after Step S1501 is completed according to an embodiment of the present disclosure.
Figure 22:
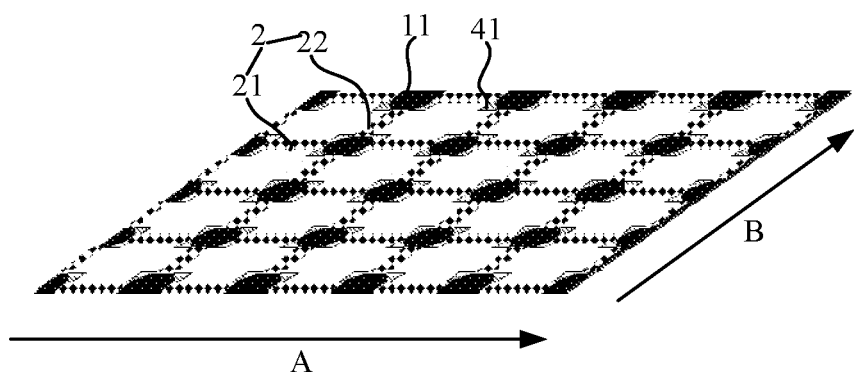
FIG. 22 is a vertical view of a structure obtained after Step S1501 is completed according to an embodiment of the present disclosure.

A lower electrode layer 41 may be formed on the sidewall of each of the epitaxial pillars 3 and each of the support pillars 11. In some embodiments, the lower electrode layer 41 conformally attached on a sidewall surface of each of the epitaxial pillars 3 and each of the support pillars 11 may be formed on the sidewall of each of the epitaxial pillars 3 and each of the support pillars 11. For the convenience of process, the lower electrode layer 41 may be synchronously formed on the sidewall of each of the epitaxial pillars 3 and each of the support pillars 11 and a top surface of each of the epitaxial pillars 3. Next, the lower electrode layer 41 positioned on the top surface of each of the epitaxial pillars 3 may be removed, and only the lower electrode layer 41 on the sidewall of each of the epitaxial pillars 3 and each of the support pillars 11 may be retained. In addition, the lower electrode layer 41 may be in contact connection with each of the plurality of conductive contact plugs, such that electric energy stored in the lower electrode layer 41 is inputted into each of the plurality of conductive contact plugs, to realize capacitance storage. In this embodiment of the present disclosure, a structure obtained after Step S1501 is completed is as shown in FIG. 21 and FIG. 22.

For example, the lower electrode layer 41 may be formed on the sidewall of each of the epitaxial pillars 3 and each of the support pillars 11 by means of vacuum evaporation, magnetron sputtering, chemical vapor deposition, physical vapor deposition or atomic layer deposition, etc. Of course, the lower electrode layer 41 may be formed by means of other processes. A material of the lower electrode layer 41 may be rubidium, rubidium oxide, titanium, titanium nitride or tungsten, etc. Of course, the material of the lower electrode layer 41 also may be other material that may be used as electrodes, and no special limitation is imposed on the material of the lower electrode layer 41 and formation processes thereof here.

Step S1502: forming a capacitor dielectric layer on a surface of the lower electrode layer.

A conformally-attached capacitor dielectric layer 42 may be formed on the surface of the lower electrode layer 41. For example, the capacitor dielectric layer 42 may be a thin film formed on the surface of the lower electrode layer 41. The capacitor dielectric layer 42 may be formed by means of vacuum evaporation, magnetron sputtering, chemical vapor deposition, physical vapor deposition or atomic layer deposition, etc. Of course, the capacitor dielectric layer 42 may also be formed by other means, which are not to be enumerated one by one here.

The capacitor dielectric layer 42 may be a single-layer film structure comprising the same material, or may be a hybrid film layer structure comprising film layers made from different materials. For example, the capacitor dielectric layer 42 may include a material having a higher dielectric constant, such as strontium titanate, aluminum oxide, hafnium oxide, lanthanum oxide, titanium oxide, zirconium oxide, tantalum oxide, niobium oxide, strontium oxide, silicon nitride or mixtures thereof. Of course, the capacitor dielectric layer 42 may also be made from other materials, which are not to be enumerated one by one here.

Step S1503: forming an upper electrode layer on the surface of the lower electrode layer.

A material of the upper electrode layer 43 may be a conductive material. For example, the material of the upper electrode layer 43 may be rubidium, rubidium oxide, titanium, titanium nitride or tungsten, etc. Of course, the material of the upper electrode layer 43 may also be other materials that may be used as electrodes, and no special limitation is imposed on the material of the upper electrode layer 43 here.

The upper electrode layer 43 may be formed on the surface of the capacitor dielectric layer 42 by means of vacuum evaporation, magnetron sputtering, chemical vapor deposition, physical vapor deposition or atomic layer deposition, etc. Of course, the upper electrode layer 43 may also be formed by means of other processes, which are not limited here.

For the convenience of process, the upper electrode layer 43 may fill up the gaps between the support pillars 11 and the gaps between the epitaxial pillars 3. The capacitor dielectric layer 42 is conformally attached on the surface of the lower electrode layer 41, and the lower electrode layer 41 is conformally attached on the surface of each of the epitaxial pillars 3 and the surface of each of support pillars 11. Therefore, the upper electrode layer 43 can fill up the gaps between the capacitor dielectric layers 42. In the present disclosure, the upper electrode layer 43, the capacitor dielectric layer 42 and the lower electrode layer 41 jointly constitute the capacitor structure 4 of the present disclosure.

In an exemplary embodiment of the present disclosure, the method of the present disclosure may further include:

Step S170: etching back the capacitor structure to form a channel.

In one embodiment, the capacitor structure 4 may be etched back by means of a wet etching process, such that the surface of the capacitor structure 4 is lower than the top surface of each of the epitaxial pillars 3. For example, the wet etching may be performed using an acidic solution such as hydrofluoric acid, which may be, for example, buffered hydrofluoric acid (BHF), hydrofluoric acid having a concentration of 49%, or diluted hydrofluoric acid (DHF). When the DHF is used as an etching solution, a preparation ratio of the hydrofluoric acid to deionized water may be 1:1 to 1:10, and no special limitation is imposed on the proportion or the concentration of the etching solution here. Of course, the surface of the capacitor structure 4 may also be etched back by means of a dry etching process as long as the surface of the capacitor structure 4 can be lower than the surface of each of the support pillars 11 by a second preset height, and no special limitation is imposed on the process of etching back the capacitor structure 4 here.

Figure 23:
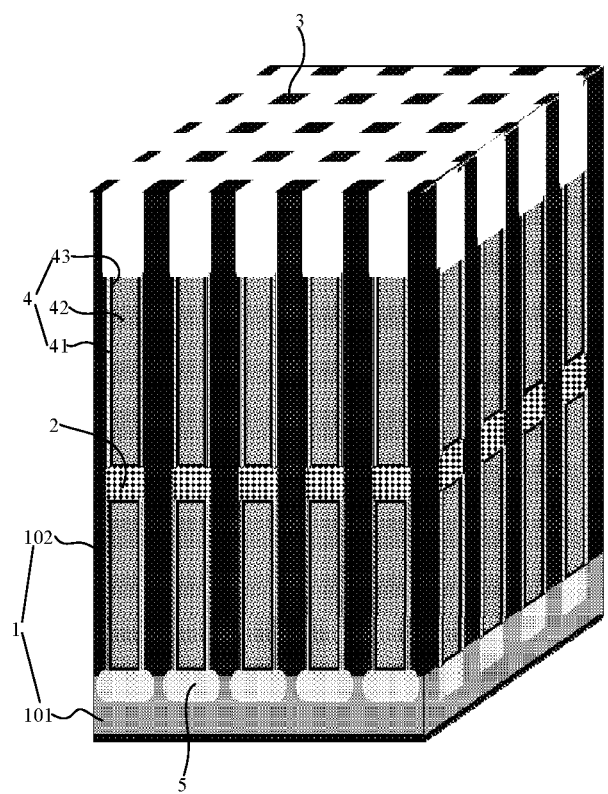
FIG. 23 is a schematic structural diagram after Step S170 is completed according to an embodiment of the present disclosure.
Figure 24:
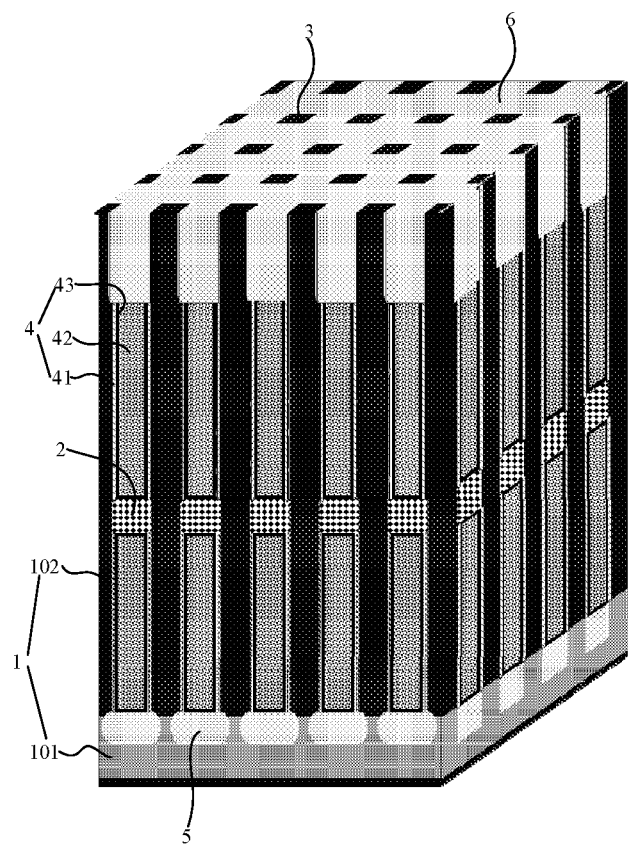
FIG. 24 is a schematic structural diagram after Step S180 is completed according to an embodiment of the present disclosure.

In an exemplary embodiment of the present disclosure, the second preset height may be 60 nm to 150 nm. For example, the second preset height may be 60 nm, 80 nm, 100 nm, 120 nm, 140 nm, or 150 nm. Of course, the second preset height may also be other heights, which are not to be enumerated one by one here. In this embodiment of the present disclosure, a structure obtained after Step S150 is completed is as shown in FIG. 23 and FIG. 24.

Step S180: forming a protective layer in the channel, the protective layer filling up the channel.

The protective layer 6 may be constituted by the insulating material 5, which may be for example, silicon oxide. The capacitor structure 4 may be separated from other structures formed subsequently by means of the insulating material 5 in the protective layer 6 to avoid coupling or short circuit. In addition, during the process of forming the other structures subsequently by means of etching, the surface of the capacitor structure 4 may be protected by the protective layer 6, which may prevent the capacitor structure 4 from being damaged, and thus the product yield can be improved. For example, a word line structure and a transistor may be formed in the protective layer 6. During this process, the word line structure and the transistor may be separated from the capacitor structure 4 by means of the protective layer 6 to avoid coupling or short circuit between the transistor and the capacitor structure 4.

In one embodiment, the insulating material 5 may be deposited on the surface of capacitor structure 4 by means of processes such as vacuum evaporation, magnetron sputtering, chemical vapor deposition, physical vapor deposition or atomic layer deposition, to form the protective layer 6 covering the capacitor structure 4, where the protective layer 6 can fill up the trenches.

The protective layer 6 can fill up the top gaps between the epitaxial pillars 3. For the convenience of process, the insulating material 5 may be deposited on the surface of each of the support pillars 11 synchronously, and the filling may be stopped after the insulating material 5 positioned on the surface of the capacitor structure 4 fills up the gaps between the epitaxial pillars 3. Next, the insulating material 5 deposited on the surface of each of the epitaxial pillars 3 is polished by means of a chemical polishing process, such that the insulating material 5 positioned on the surface of each of the epitaxial pillars 3 is removed, and only the insulating material 5 positioned on the surface of the capacitor structure 4 is retained. In this way, the protective layer 6 is retained on the surface of the capacitor structure 4. In this embodiment of the present disclosure, a structure obtained after Step S180 is completed is as shown in FIG. 24.

It is to be noted that steps of the method for fabricating a semiconductor structure in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

An embodiment of the present disclosure further provides a semiconductor structure, which may include a capacitor structure 4 and a transistor, and the transistor may be formed on the capacitor structure 4. As shown in FIG. 23, the semiconductor structure may include a substrate 1, a support layer 2, a plurality of epitaxial pillars 3, and a capacitor structure 4.

The substrate 1 includes a plurality of groups of support pillars 11 spaced apart along the first direction A, each of the plurality of groups of support pillars 11 are spaced apart along the second direction B, and the first direction A intersects with the second direction B.

The support layer 2 is filled in top gaps between adjacent support columns 11.

The plurality of epitaxial pillars 3 are formed on tops of the support pillars 11 in one-to-one correspondence.

The capacitor structure 4 is formed on the surface of the structure jointly constituted by each of the plurality of epitaxial pillars 3 and each of the support pillars 11.

In the semiconductor structure of the present disclosure, the plurality of epitaxial pillars 3 may be grown on the support pillars 11 by means of an epitaxial growth process, and then the capacitor structure 4 may be formed on the surface of the structure jointly constituted by each of the support pillars 11 and each of the plurality of epitaxial pillars 3. In this process, in one aspect, a height of each of the support pillars formed by means of initial etching may be appropriately reduced to avoid insufficient etching, such that the capacitor structure 4 formed subsequently is not prone to floating. In another aspect, each of the support pillars 11 has a lower height, which can prevent collapse of each of the support pillars 11, thereby preventing collapse of the capacitor structure 4 formed thereon. Furthermore, the capacitor structure 4 may be supported by the support layer 2, which can further prevent collapse of the capacitor structure 4, thereby improving the product yield. In addition, by forming the plurality of epitaxial pillars 3 on the support pillar 11, a height of a pillar body may be increased, such that the height of the capacitor structure 4 formed on the surface of each of the plurality of epitaxial pillars 3 is increased, to achieve the objective of increasing storage capacity of the capacitor.

Details of the semiconductor structure in this embodiment of the present disclosure will be described in detail below:

As shown in FIG. 2, the substrate 1 may have a flat plate structure, which may be rectangular, circular, elliptical, polygonal or irregular, and a material of the substrate 1 may be silicon or other semiconductor materials. The shape and the material of the substrate 1 are not limited here.

The substrate 1 may include a base substrate and an insulating layer formed on the base substrate, and a plurality of conductive contact plugs distributed side by side are formed in the insulating layer. The plurality of conductive contact plugs may be separated from each other by the insulating layer to avoid occurrence of coupling between the plurality of conductive contact plugs or generation of parasitic capacitance. Each of the plurality of conductive contact plugs may be made from conductor or semiconductor material, which may be, for example, tungsten, copper, or polysilicon, etc.

For example, a plurality of via holes distributed in an array may be arranged in the insulating layer, each of the plurality of via holes may be a through hole, and each of the plurality of conductive contact plugs may be formed in each of the plurality of via holes. For example, each of the plurality of conductive contact plugs may be formed in each of the plurality of via holes by means of vacuum evaporation, magnetron sputtering, chemical vapor deposition, physical vapor deposition, or atomic layer deposition, etc. Of course, the plurality of conductive contact plugs may also be formed by other means, which are not to be enumerated here.

The present disclosure may include a plurality of groups of conductive contact plugs spaced apart along the first direction A. For example, each of the plurality of groups of conductive contact plugs may be uniformly spaced apart along the first direction A; and the plurality of groups of conductive contact plugs may be spaced apart along the second direction B. For example, each of the plurality of groups of conductive contact plugs may be uniformly spaced apart along the second direction B. The first direction A and the second direction B may be perpendicular to each other. That is, each of the plurality of conductive contact plugs may be distributed in an array in the form of rows and columns.

It is to be noted that the perpendicular may be absolutely perpendicular or approximately perpendicular, because deviations are unavoidable in the manufacturing process. In the present disclosure, deviation of an angle may be caused by limitations on fabrication technologies, such that there is a certain deviation of an angle between the first direction A and the second direction B. However, it may be considered that the first direction A is perpendicular to the second direction B as long as the deviation of the angle between the first direction A and the second direction B is within a preset range. For example, the preset range may be 10°. That is, when the angle between the first direction A and the second direction B is within a range of greater than or equal to 80° and less than or equal to 100°, it may be considered that the first direction A is perpendicular to the second direction B.

In one embodiment, the substrate 1 may be internally provided with a shallow trench isolation structure and a bit line structure. The shallow trench isolation structure may divide the substrate 1 into a plurality of active areas, the bit line structure and each of the plurality of conductive contact plugs are positioned on top of each of the plurality of active areas, and the bit line structure is alternately arranged with each of the plurality of conductive contact plugs in the substrate 1.

In an exemplary embodiment of the present disclosure, the substrate 1 may include a first doped region 101 and a second doped region 102, where the first doped region 101 and the second doped region 102 may be adjacently distributed, and may be stacked along the thickness direction. P-type doping may be performed on the substrate 1 by means of ion implantation. For example, P-type doped material may be doped into the first doped region 101 to form a P-type semiconductor in the first doped region 101. The P-type doped material may be an element in main group III in Periodic Table of the Elements, for example, boron. Of course, the P-type doped material may also be materials of other elements, which are not to be enumerated one by one here.

In an exemplary embodiment of the present disclosure, each of the plurality of conductive contact plugs may be positioned in the first doped region 101, and each of the plurality of conductive contact plugs may be distributed in an array in this doped region.

N-type doping may be performed on the substrate 1 by means of ion implantation, to form a P-N junction. For example, N-type doped material may be doped into the second doped region 102 to form an N-type semiconductor in the second doped region 102. The P-type semiconductor in the first doped region 101 and the N-type semiconductor in the second doped region 102 may form the P-N junction. The N-type doped material may be an element in main group IV in Periodic Table of the Elements, for example, phosphorus. Of course, the N-type doped material may also be materials of other elements, which are not to be enumerated one by one here.

In the present disclosure, a plurality of groups of support pillars 11 spaced apart along the first direction A may be formed in the substrate 1. For example, each of the plurality of groups of support pillars 11 may be uniformly spaced apart along the first direction A; and the plurality of groups of support pillars 11 may be spaced apart along the second direction B. For example, each of the plurality of groups of support pillars 11 may be uniformly spaced apart along the second direction B. The first direction A and the second direction B may be different directions. For example, the first direction A may intersect with the second direction B. For example, the first direction A and the second direction B may be perpendicular to each other. That is, the plurality of groups of support pillars 11 may be distributed in an array in the form of rows and columns.

The support pillars 11 and the substrate 1 may be made from the same material, for example, single crystal silicon. A height of the support pillar 11 may be 50 nm to 100 nm. For example, the height of the support pillar 11 may be 50 nm, 60 nm, 70 nm, 80 nm, 90 nm or 100 nm. Of course, other heights are also permissible, which are not enumerated one by one here.

In an exemplary embodiment of the present disclosure, the support pillars 11 may be positioned in the second doped region 102, and an end of each of the support pillars 11 close to the first doped region 101 may be in contact connection with the first doped region 101. That is, the support pillars 11 may be N-type semiconductors, a P-N junction may be formed between each of the support pillars 11 and the first doped region 101, and current leakage may be reduced by means of a depletion region of the P-N junction.

In an exemplary embodiment of the present disclosure, as shown in FIG. 4, a plurality of first trenches 12 may be formed in the substrate 1, each of the plurality of first trenches 12 may extend along the first direction A, and the plurality of first trenches 12 may be spaced apart along the second direction B. In the second direction B, the support pillars 11 may be positioned between adjacent two of the plurality of first trenches 12, and each of the support pillars 11 may be alternately arranged with each of the plurality of first trenches 12. In the thickness direction of the substrate 1, the plurality of first trenches 12 may extend into the first doped region 101.

As shown in FIG. 2, a plurality of second trenches 13 may also be formed in the substrate 1, each of the plurality of second trenches 13 may extend along the second direction B, and the plurality of second trenches 13 may be spaced apart along the first direction A. In the first direction A, the support pillars 11 are positioned between adjacent two of the plurality of second trenches 13, and each of the support pillars 11 may be alternately arranged with each of the plurality of second trenches 13. In the thickness direction of the substrate 1, a given one of the plurality of second trenches 13 may extend into the first doped region 101, and a size of a part of the given second trench 13 extending into the first doped region 101 in the first direction A is greater than a pitch between adjacent two of the support pillars 11.

The insulating material 5 may be formed in each of the plurality of first trenches 12 and each of the plurality of second trenches 13, and the insulating material 5 may be silicon oxide. A size of the insulating material 5 in each of the plurality of second trenches 13 on the first doped region 101 in the first direction A is greater than the pitch between adjacent two of the support pillars 11. Therefore, current leakage can be reduced by reducing contact between the substrate 1 and each of the support pillars 11 by means of the insulating material 5 in coordination with the depletion region of the P-N junction formed between the first doped region 101 and the second doped region 102.

As shown in FIG. 6, the support layer 2 may be filled into the top gaps between the adjacent two of the support pillars 11, and transverse support may be provided to the support pillars 11 by means of the support layer 2, to prevent collapse of the support pillars 11. In an exemplary embodiment of the present disclosure, the support layer 2 may include a first extended portion 21 and a second extended portion 22, and the first extended portion 21 and the second extended portion 22 may be filled into an end of each of the support pillars 11 facing away from the first extended portion 21. For example, the first extended portion 21 may fill up the top gaps between the support pillars 11 spaced apart along the first direction A, and the first extended portion 21 can provide, in the first direction A, transverse support to the support pillars 11 spaced apart along the first direction A, to prevent collapse of the support pillars 11. The second extended portion 22 may fill up the top gaps between the support pillars 11 spaced apart along the second direction B, and the second extended portion 22 can provide, in the second direction B, transverse support to the support pillars 11 spaced apart along the second direction B, to further prevent collapse of the support pillars 11.

In an exemplary embodiment of the present disclosure, the thickness of each of the support layers 2 may be 10 nm to 50 nm. For example, the thickness of each of the support layers 2 may be 10 nm, 20 nm, 30 nm, 40 nm or 50 nm. Of course, other thicknesses may also be permissible, which are not to be enumerated one by one here.

As shown in FIG. 15, the plurality of epitaxial pillars 3 may be formed on the tops of the support pillars 11 in a one-to-one correspondence. For example, epitaxial growth of single crystal silicon may be performed on the top of each of the support pillars 11 by means of the epitaxial growth process. During this process, limited by the insulating material 5 and the support material, during the process of epitaxial growth, a single crystal silicon film layer is not to be formed on the surface of the insulating material 5 and the support material, instead only a single crystal film layer is formed on the top of each of the support pillars 11. In the above process, a height of a pillar body may be increased, such that the height of the capacitor structure 4 formed on the surface of the epitaxial pillar 3 is increased, to achieve the objective of increasing storage capacity of the capacitor. In addition, the etching process may be avoided, such that the problem of insufficient etching may be avoided, and the product yield may be improved.

In an exemplary embodiment of the present disclosure, a ratio of a height of the epitaxial pillar 3 to a height of the support pillar 11 may be one third to five thirds. For example, the height of the epitaxial pillar 3 may be the same as the height of each of the support pillars 11, or the height of the epitaxial pillar 3 may be one third, two thirds, four thirds or five thirds of the height of each of the support pillars 11. Of course, the epitaxial pillar 3 may also have other heights, which are not to be enumerated one by one here.

As shown in FIG. 17, the capacitor structure 4 may be conformally attached on a sidewall surface of each of the epitaxial pillars 3 and each of the support pillars 11. An orthographic projection of the capacitor structure 4 on the first doped region 101 may be at least partially overlapped with each of the plurality of conductive contact plugs in the first doped region 101, such that the capacitor structure 4 may be in contact connection with each of the plurality of conductive contact plugs, to store charges collected by the capacitor structure 4 through each of the plurality of conductive contact plugs.

For example, the capacitor structure 4 may be formed on the sidewall of the structure jointly constituted by each of the epitaxial pillars 3 and each of the support pillars 11 by means of vacuum evaporation, magnetron sputtering, chemical vapor deposition, physical vapor deposition or atomic layer deposition, etc. Of course, the capacitor structure 4 may also be formed by means of other processes, and no special limitation is imposed on processes of forming the capacitor structure 4 here.

In an exemplary embodiment of the present disclosure, the capacitor structure 4 may include a lower electrode layer 41, a capacitor dielectric layer 42, and an upper electrode layer 43.

The lower electrode layer 41 may be conformally attached on the surface of the structure jointly constituted by each of the epitaxial pillars 3 and each of the support pillars 11. In some embodiments, the lower electrode layer 41 conformally attached on a sidewall surface of each of the epitaxial pillars 3 and each of the support pillars 11 may be formed on a sidewall of each of the epitaxial pillars 3 and each of the support pillars 11, where the lower electrode layer 41 may be conformally attached on the surface of the sidewall of each of the epitaxial pillars 3 and each of the support pillars 11. The lower electrode layer 41 may be a thin film formed on the sidewall surface of each of the epitaxial pillars 3 and each of the support pillars 11, or may be a coating formed on the sidewall surface of each of the epitaxial pillars 3 and each of the support pillars 11, and no special limitation is imposed on form of the lower electrode layer 41 here.

An end of the lower electrode layer 41 close to the first doped region 101 may be in contact connection with each of the plurality of conductive contact plugs, such that electric energy stored in the lower electrode layer 41 is inputted into each of the plurality of conductive contact plugs, to realize capacitance storage.

A material of the lower electrode layer 41 may be rubidium, rubidium oxide, titanium, titanium nitride or tungsten, etc. Of course, the material of the lower electrode layer 41 may also be other materials that may be used as electrodes, and no special limitation is imposed on the material of the lower electrode layer 41 here.

For example, the lower electrode layer 41 may be formed on the sidewall of each of the epitaxial pillars 3 and each of the support pillars 11 by means of vacuum evaporation, magnetron sputtering, chemical vapor deposition, physical vapor deposition or atomic layer deposition, etc. Of course, the lower electrode layer 41 may be formed by means of other processes. A material of the lower electrode layer 41 may be rubidium, rubidium oxide, titanium, titanium nitride or tungsten, etc. Of course, the material of the lower electrode layer 41 also may be other material that may be used as electrodes, and no special limitation is imposed on the material of the lower electrode layer 41 and formation processes thereof here.

The capacitor dielectric layer 42 may be conformally attached to the surface of the lower electrode layer 41, where the capacitor dielectric layer 42 may be a thin film formed on the surface of the lower electrode layer 41, or may be a coating formed on the surface of the lower electrode layer 41, and no special limitation is imposed on form of the capacitor dielectric layer 42 here.

For example, the capacitor dielectric layer 42 may be a thin film formed on the surface of the lower electrode layer 41. The capacitor dielectric layer 42 may be formed by means of vacuum evaporation, magnetron sputtering, chemical vapor deposition, physical vapor deposition or atomic layer deposition, etc. Of course, the capacitor dielectric layer 42 may also be formed by other means, which are not to be enumerated one by one here.

The capacitor dielectric layer 42 may be a single-layer film structure comprising the same material, or may be a hybrid film layer structure comprising film layers made from different materials. For example, the capacitor dielectric layer 42 may include a material having a higher dielectric constant, such as strontium titanate, aluminum oxide, hafnium oxide, lanthanum oxide, titanium oxide, zirconium oxide, tantalum oxide, niobium oxide, strontium oxide, silicon nitride or mixtures thereof. Of course, the capacitor dielectric layer 42 may also be made from other materials, which are not to be enumerated one by one here.

The upper electrode layer 43 may be formed on the surface of the lower electrode layer 41. A material of the upper electrode layer 43 may be a conductive material. For example, the material of the upper electrode layer 43 may be rubidium, rubidium oxide, titanium, titanium nitride or tungsten, etc. Of course, the material of the upper electrode layer 43 may also be other materials that may be used as electrodes, and no special limitation is imposed on the material of the upper electrode layer 43 here.

The upper electrode layer 43 may be formed on the surface of the capacitor dielectric layer 42 by means of vacuum evaporation, magnetron sputtering, chemical vapor deposition, physical vapor deposition or atomic layer deposition, etc. Of course, the upper electrode layer 43 may also be formed by means of other processes, which are not limited here.

The upper electrode layer 43 may fill up the gaps between the support pillars 11 and the gaps between the epitaxial pillars 3. The capacitor dielectric layer 42 is conformally attached on the surface of the lower electrode layer 41, and the lower electrode layer 41 is conformally attached on the surface of each of the epitaxial pillars 3 and the surface of each of support pillars 11. Therefore, the upper electrode layer 43 can fill up the gaps between the capacitor dielectric layers 42. In the present disclosure, the upper electrode layer 43, the capacitor dielectric layer 42 and the lower electrode layer 41 jointly constitute the capacitor structure 4 of the present disclosure.

In an exemplary embodiment of the present disclosure, the capacitor structure 4 may be etched back, such that an end of the capacitor structure 4 facing away from the support layer 2 is lower than the top of each of the epitaxial pillars 3. In one embodiment, the capacitor structure 4 may be etched back by means of a wet etching process, such that the surface of the capacitor structure 4 is lower than the top surface of each of the epitaxial pillars 3. For example, the wet etching may be performed using an acidic solution such as hydrofluoric acid, which may be, for example, buffered hydrofluoric acid (BHF), hydrofluoric acid having a concentration of 49%, or diluted hydrofluoric acid (DHF). When the DHF is used as an etching solution, a preparation ratio of the hydrofluoric acid to deionized water may be 1:1 to 1:10, and no special limitation is imposed on the proportion or the concentration of the etching solution here. Of course, the surface of the capacitor structure 4 may also be etched back by means of a dry etching process as long as the surface of the capacitor structure 4 can be lower than the surface of each of the support pillars 11 by a second preset height, and no special limitation is imposed on the process of etching back the capacitor structure 4 here.

In an exemplary embodiment of the present disclosure, the second preset height may be 60 nm to 150 nm. For example, the second preset height may be 60 nm, 80 nm, 100 nm, 120 nm, 140 nm, or 150 nm. Of course, the second preset height may also be other heights, which are not to be enumerated one by one here.

The semiconductor structure of the present disclosure further includes a protective layer 6, as shown in FIG. 24, the protective layer 6 may be constituted by the insulating material 5, which may be, for example, silicon oxide. The capacitor structure 4 may be separated from other structures formed subsequently by means of the insulating material 5 in the protective layer 6 to avoid coupling or short circuit. In addition, during the process of forming the other structures subsequently by means of etching, the surface of the capacitor structure 4 may be protected by the protective layer 6, which may prevent the capacitor structure 4 from being damaged, and thus the product yield can be improved. For example, a word line structure and a transistor may be formed in the protective layer 6. During this process, the word line structure and the transistor may be separated from the capacitor structure 4 by means of the protective layer 6 to avoid coupling or short circuit between the transistor and the capacitor structure 4.

In one embodiment, the insulating material 5 may be deposited on the surface of capacitor structure 4 by means of processes such as vacuum evaporation, magnetron sputtering, chemical vapor deposition, physical vapor deposition or atomic layer deposition, to form the protective layer 6 covering the capacitor structure 4.

The protective layer 6 can fill up the top gaps between the epitaxial pillars 3. For the convenience of process, the insulating material 5 may be deposited on the surface of each of the support pillars 11 synchronously, and the filling may be stopped after the insulating material 5 positioned on the surface of the capacitor structure 4 fills up the gaps between the epitaxial pillars 3. Next, the insulating material 5 deposited on the surface of each of the epitaxial pillars 3 is polished by means of a chemical polishing process, such that the insulating material 5 positioned on the surface of each of the epitaxial pillars 3 is removed, and only the insulating material 5 positioned on the surface of the capacitor structure 4 is retained. In this way, the protective layer 6 is formed on the surface of the capacitor structure 4.

An embodiment of the present disclosure further provides a memory, which may include the semiconductor structure in any one of the above embodiments, and its details, formation process and beneficial effects have been described in detail in the corresponding method for fabricating a semiconductor structure and the semiconductor structure, and thus detailed description of the memory is omitted here.

For example, the memory may be a dynamic random access memory (DRAM), a static random access memory (SRAM) or the like. Of course, the memory may also be other storage apparatuses, which are not to be enumerated one by one here.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A method for forming a semiconductor structure, comprising:
   providing a substrate;
   forming a plurality of groups of support pillars spaced apart along a first direction in the substrate, each of the plurality of groups of support pillars being spaced apart along a second direction, the first direction intersecting with the second direction;

forming a support layer filling up top gaps between adjacent two of the support pillars;

forming an epitaxial pillar on a top of each of the support pillars respectively by means of an epitaxial growth process; and forming a capacitor structure on a surface of a structure jointly constituted by each of the epitaxial pillars and each of the support pillars;

wherein the forming a plurality of groups of support pillars spaced apart along a first direction in the substrate, each of the plurality of groups of support pillars being spaced apart along a second direction, the first direction intersecting with the second direction comprises:

forming a plurality of first trenches extending along the first direction in the substrate, each of the plurality of first trenches being spaced apart along the second direction;

filling an insulating material into each of the plurality of first trenches; and etching the substrate and the insulating material along the second direction to form a plurality of groups of support pillars spaced apart along the second direction in the substrate.

2. The method according to claim 1, wherein each of the support layers comprises a first extended portion and a second extended portion, the first extended portion being filled in the top gaps between the support pillars spaced apart along the first direction, and the second extended portion being filled in the top gaps between the support pillars spaced apart along the second direction.

3. The method according to claim 1, wherein the substrate comprises a first doped region and a second doped region distributed adjacently along a thickness direction, the method further comprising:

performing P-type doping on the first doped region; and performing N-type doping on the second doped region, the support pillars being positioned in the second doped region and being in contact connection to the first doped region.

4. The method according to claim 3, wherein the etching the substrate and the insulating material along the second direction to form a plurality of groups of support pillars spaced apart along the second direction in the substrate comprises:

etching the substrate and the insulating material along the second direction using a Bosch etch process to form a plurality of second trenches spaced apart along the first direction, a given one of the plurality of second trenches extending into the first doped region, and a size of a part of the given second trench extending into the first doped region in the first direction being greater than a pitch between adjacent two of the support pillars.

5. The method according to claim 4, wherein each of the support layers comprises a first extended portion and a second extended portion, the first extended portion being filled in the top gaps between the support pillars spaced apart along the first direction, and the second extended portion being filled in the top gaps between the support pillars spaced apart along the second direction, and wherein the first extended portion and the second extended portion are formed by:

filling the insulating material into each of the plurality of second trenches, the insulating material in each of the plurality of second trenches and the insulating material in each of the plurality of first trenches jointly constitute a sacrificial layer;

etching back the sacrificial layer, such that a surface of the sacrificial layer is lower than a surface of each of the support pillars;

forming a reference support layer covering the sacrificial layer, the reference support layer filling up the top gaps between the support pillars;

etching the reference support layer along the second direction to form a third trench between adjacent two of the plurality of groups of support pillars, and retaining the reference support layer between the support pillars spaced apart along the second direction to form the second extended portion;

filling the insulating material into the third trench;

etching the insulating material in the third trench along the first direction to remove the insulating material between adjacent two of the support pillars; and filling a support material into the gaps between the support pillars spaced apart along the first direction to form the first extended portion.

6. The method according to claim 5, further comprising:

removing the sacrificial layer and the insulating material positioned in the second doped region before the capacitor structure is formed on the surface of the structure jointly constituted by each of the epitaxial pillars and each of the support pillars.

7. The method according to claim 3, wherein the first doped region further comprises a plurality of conductive contact plugs distributed in an array, an orthographic projection of the capacitor structure on the first doped region being at least partially overlapped with each of the plurality of conductive contact plugs, and the capacitor structure being in contact connection with each of the plurality of conductive contact plugs.

8. The method according to claim 7, wherein the forming a capacitor structure on a surface of a structure jointly constituted by each of the epitaxial pillars and each of the support pillars comprises:

forming a conformally-attached lower electrode layer on the surface of the structure jointly constituted by each of the epitaxial pillars and each of the support pillars, an end of the lower electrode layer close to the first doped region being in contact connection with each of the plurality of conductive contact plugs;

forming a capacitor dielectric layer on a surface of the lower electrode layer; and forming an upper electrode layer on the surface of the lower electrode layer.

9. The method according to claim 8, wherein the upper electrode layer fills up the gaps between the support pillars and the gaps between the epitaxial pillars, the method further comprising:

etching back the capacitor structure to form a channel; and forming a protective layer in the channel, the protective layer filling up the channel.

10. A semiconductor structure, comprising:

a substrate comprising a plurality of groups of support pillars spaced apart along a first direction, each of the plurality of groups of support pillars being spaced apart along a second direction, the first direction intersecting with the second direction;

a support layer filled in a top gap between adjacent two of the support pillars;

a plurality of epitaxial pillars formed on tops of the support pillars in one-to-one correspondence; and a capacitor structure formed on a surface of a structure jointly constituted by each of the epitaxial pillars and each of the support pillars;

wherein the substrate comprises a first doped region and a second doped region distributed adjacently along a thickness direction, the first doped region being a P-type doped region, the second doped region being an N-type doped region, the support pillars being positioned in the second doped region and being in contact connection with the first doped region.

11. The semiconductor structure according to claim 10, wherein the support layer comprises a first extended portion and a second extended portion, the first extended portion being filled in the top gaps between the support pillars spaced apart along the first direction, and the second extended portion being filled in the top gaps between the support pillars spaced apart along the second direction.

12. The semiconductor structure according to claim 11, wherein a thickness of the support layer ranges from 10 nm to 50 nm.

13. The semiconductor structure according to claim 10, wherein in the substrate there are formed a plurality of first trenches extending along the first direction and spaced apart along the second direction and a plurality of second trenches extending along the second direction and spaced apart along the first direction, in the first direction the support pillars being positioned between adjacent two of the plurality of second trenches, and in the second direction the support pillars being positioned between adjacent two of the plurality of first trenches;

in the thickness direction of the substrate, a given one of the plurality of first trenches and a given one of the plurality of second trenches both extend into the first doped region, a size of a part of the given second trench extending into the first doped region in the first direction being greater than a pitch between adjacent two of the support pillars; and an insulating material is formed in each of the plurality of first trenches in the first doped region and in each of the plurality of second trenches in the first doped region.

14. The semiconductor structure according to claim 10, wherein the first doped region further comprises a plurality of conductive contact plugs distributed in an array, an orthographic projection of the capacitor structure on the first doped region being at least partially overlapped with each of the plurality of conductive contact plugs, and the capacitor structure being in contact connection with each of the plurality of conductive contact plugs.

15. The semiconductor structure according to claim 14, wherein the capacitor structure comprises:

a lower electrode layer conformally attached on the surface of the structure jointly constituted by each of the epitaxial pillars and each of the support pillars, an end of the lower electrode layer close to the first doped region being in contact connection with each of the plurality of conductive contact plugs;

a capacitor dielectric layer formed on a surface of the lower electrode layer; and an upper electrode layer formed on the surface of the lower electrode layer.

16. The semiconductor structure according to claim 15, wherein the upper electrode layer fills up the gaps between the support pillars and the gaps between the epitaxial pillars, an end of the capacitor structure facing away from the support layer being lower than a top of the epitaxial pillar, the semiconductor structure further comprising:

a protective layer covering the surface of the capacitor structure and filling up the gaps between the epitaxial pillars.

17. The semiconductor structure according to claim 10, wherein a ratio of a height of the epitaxial pillar to a height of the support pillar is one third to five thirds.

18. A memory comprising a semiconductor structure, wherein the semiconductor structure comprises:

a substrate comprising a plurality of groups of support pillars spaced apart along a first direction, each of the plurality of groups of support pillars being spaced apart along a second direction, the first direction intersecting with the second direction;

a support layer filled in a top gap between adjacent two of the support pillars;

a plurality of epitaxial pillars formed on tops of the support pillars in one-to-one correspondence; and a capacitor structure formed on a surface of a structure jointly constituted by each of the epitaxial pillars and each of the support pillars;

wherein the substrate comprises a first doped region and a second doped region distributed adjacently along a thickness direction, the first doped region being a P-type doped region, the second doped region being an N-type doped region, the support pillars being positioned in the second doped region and being in contact connection with the first doped region.

* * * * *